United States Patent [19]
Niwayama

[11] Patent Number: 5,345,095
[45] Date of Patent: Sep. 6, 1994

[54] SELF ARC-EXTINGUISHING THYRISTOR AND METHOD OF MANUFACTURING THE SAME

[75] Inventor: Kazuhiko Niwayama, Fukuoka, Japan

[73] Assignee: Mitsubishi Denki Kabushiki Kaisha, Tokyo, Japan

[21] Appl. No.: 12,464

[22] Filed: Feb. 2, 1993

[30] Foreign Application Priority Data

May 6, 1992 [JP] Japan ................... 4-113594

[51] Int. Cl.$^5$ ................ H01L 29/74; H01L 31/111
[52] U.S. Cl. ................... 257/138; 257/137; 257/139; 257/144
[58] Field of Search ............. 257/137, 138, 139, 144, 257/147

[56] References Cited

U.S. PATENT DOCUMENTS

| | | |
|---|---|---|
| 4,847,671 | 6/1989 | Pattanayak et al. |
| 4,914,496 | 4/1990 | Nakagawa et al. ........ 257/138 |

FOREIGN PATENT DOCUMENTS

| | | |
|---|---|---|
| 0039943 | 11/1981 | European Pat. Off. |
| 0062099 | 10/1982 | European Pat. Off. |
| 0106059 | 4/1984 | European Pat. Off. |
| 0454201 | 10/1991 | European Pat. Off. |
| 4130889 | 3/1992 | Fed. Rep. of Germany |
| 56-80165 | 7/1981 | Japan |
| 60-189261 | 9/1985 | Japan |

OTHER PUBLICATIONS

3rd International Symposium On Power Semiconductor Devices and ICS, Apr. 1991, pp. 128–131, M. S. Shekar, et al., "Experimental Demonstration of the Emitter Switched Thyristor".

3rd Interanational Symposium On Power Semiconductor and ICS, Proceedings, Apr. 1991, pp. 132–137, H. Sumida, et al., "Numerical Analysis of Switching in the IGBT Triggered Thyristor".

Patent Abstracts of Japan, vol. 8, No. 198 (E-265)(1635), Sep. 11, 1984, & JP-A-59 086 262 May 18, 1984.

*Primary Examiner*—William L. Sikes
*Assistant Examiner*—Fetsum Abraham
*Attorney, Agent, or Firm*—Oblon, Spivak, McClelland, Maier & Neustadt

[57] ABSTRACT

A self arc-extinguishing thyristor having a large main current is disclosed. An n-type base layer is formed on a p-type anode layer. The n-type base layer includes in its top center portion a relatively heavily doped p+-type region which is surrounded by p-type region. A p-type base layer is locally coated at its top surface with a relatively thin first n-type emitter layer and a relatively thick second n-type emitter layer. A gate electrode buried in a gate oxide film is disposed on two channel regions and areas around the same. This structure suppresses a current amplification factor of a parasitic thyristor which is formed by the n-type base layer, the p-type region and the first n-type emitter layer, which in turn represses latching up of the parasitic thyristor.

17 Claims, 20 Drawing Sheets

SELF ARC-EXTINGUISHING THYRISTOR AND METHOD OF MANUFACTURING THE SAME

BACKGROUND OF THE INVENTION

1. Field of the Invention

The present invention relates to a self arc-extinguishing thyristor in which a current flow is MOS gate-controlled.

2. Description of the Background Arts

Existing IGBTs (Insulated Gate Bipolar Transistor) are known for their excellent gate-voltage controlled turning on and off of a main current. FIG. 1 shows a basic structure of an IGBT in cross section. An n-type base layer 2 is formed on a p-type anode layer 1. In a top center portion of the n-type base layer 2, a p-type base layer 3 is selectively formed. The p-type base layer 3 consists of a relatively heavily doped p+-type center region 3a and a p-type region 3b surrounding the p+-type region 3a.

An n-type emitter layer 4a is selectively formed in a top portion of the p-type base layer 3. A top surface portion of the n-type emitter layer 4a and the top surface of the p+-type region 3a contiguous thereto serve as a cathode surface 6 in direct contact with which a cathode electrode 10 is disposed. An anode electrode 12 is disposed in contact with an anode surface 11, or the bottom surface of the p-type anode layer 1.

A gate electrode 8 which is buried in a gate oxide film 7 lies over the p-type region 3b. By controlling a gate voltage applied to the gate electrode 8, a main current is allowed and prohibited between the cathode electrode 10 and the anode electrode 12.

The current control by the gate voltage, however, does not work if a cathode-anode current develops large, thereby causing thyristor effect which latches and turns on a four-layer structure formed by the p-type anode layer 1, the n-type base layer 2, the p-type base layer 3 and the n-type emitter layer 4a. Once this has happened, the gate-voltage control of current becomes impossible, and hence, the four-layer structure would not turn off, eventually resulting in destruction of the device.

As an improved self arc-extinguishing thyristor in which such a problem facing IGBTs is solved, an EST (Emitter Switched Thyristor) was proposed. In an EST, even if thyristor effect latched the four-layer structure formed by the p-type anode layer 1, the n-type base layer 2, the p-type base layer 3 and the n-type emitter layer 4a, it is possible to turn off the four-layer structure by removing the gate voltage. More importantly, an EST purposely causes the latching and utilizes it in an attempt to attain extended control of a main current. An example of the EST is disclosed by B. J. Baliga in "IEEE ELECTRON DEVICE LETTERS," Volume 11, page 75.

FIG. 2 shows a cross sectional structures of an EST unit cell 100. An n-type base layer 2 is formed on a p-type anode layer 1. The n-type layer 2 has at its interface with the p-type anode layer 1 a pn junction $J_1$. A p-type base layer 3 is selectively formed in the n-type base layer 2 so as to occupy a top center portion of the cell 100. The p-type base layer 3 consists of a relatively heavily doped p+-type center region 3a and a p-type region 3b surrounding the p+-type region 3a. A pn junction $J_2$ is created at an interface between the n-type base layer 2 and the p-type base layer 3.

A first n-type emitter layer 4 and a second n-type emitter layer 5 are selectively formed in a top portion of the p-type base layer 3. The first n-type emitter layer 4 corresponds to the n-type emitter layer 4a of the IGBT of FIG. 1. A cathode surface 6 is formed by a portion of the top surface of the first n-type emitter layer 4 and the top surface of the p+-type region 3a contiguous to the same. The second n-type emitter layer 5 surrounds the first n-type emitter layer 4. The p-type emitter layer 3 has at its interfaces with the first n-type emitter layer 4 and the second n-type emitter layer 5 pn junctions $J_3$ and $J_4$, respectively.

Two channel regions are formed in the vicinity of the top surface of the p-type region 3b, one between the first n-type emitter layer 4 and the second n-type emitter layer 5, namely a first channel region CH1, and the other between the second n-type emitter layer 5 and the n-type base layer 2, namely a second channel region CH2. The channel regions CH1 and CH2 are in a faced relation with gate electrodes 8a and 8b, respectively, which are buried in a gate oxide film 7 and which are electrically connected with an external gate electrode G.

The gate oxide film 7 and the cathode surface 6 are entirely covered with a cathode electrode 10. Hence, the gate oxide film 7 insulates the cathode electrode 10 from both the gate electrodes 8a and 8b and the second n-type emitter layer 5. The p-type base layer 3 and the first n-type emitter layer 4 are electrically connected with each other via the cathode electrode 10. The cathode electrode 10 is electrically connected with an external cathode electrode K.

An anode electrode 12 is disposed entirely across the bottom surface of the p-type anode layer 1, or an anode surface 11, so that the p-type anode layer 1 and the anode electrode 12 are electrically connected with each other. The anode electrode 12 is connected with an external anode electrode A.

EST cells having a geometry as that of the unit cell 100 are arranged in parallel to each other in a matrix to thereby form an EST pellet. The gate electrodes 8a, 8b and the anode electrodes 12 of the respective unit cells 100 are electrically connected with each other.

For example, the gate electrodes 8a, 8b of each cell 100 are connected with the gate electrodes 8a, 8b of a neighboring cell 100, and the gate electrodes 8a, 8b as a whole and the external gate electrode G are connected with each other by an aluminum or other suitable wire. The anode electrodes 12 are brazed to the external anode electrode A. The cathode electrodes 10 of the respective cells are also connected with each other, and further connected with the external cathode electrode K by an aluminum or other suitable wire.

In the following, behavior of the EST device will be explained focusing on one unit cell 100. First, assume that the gate electrodes 8a, 8b are kept at the same potential as the cathode electrode 10 and the anode electrode 12 is kept at a higher potential than the cathode electrode 10. In this case, the pn junction $J_2$ is reverse-biased, thereby allowing no current between the anode electrode 12 and the cathode electrode 10.

Next, assume that the anode electrode 12 is maintained at a higher potential than the cathode electrode 10 and the gate electrodes 8a, 8b are also maintained at a higher potential than the cathode electrode 10. In this case, charge storage occurs in the gate electrodes 8a, 8b and the channel regions CH1 and CH2 since the p-type region 3b is electrically connected with the cathode electrode 10 through the p+-type region 3a while the gate electrodes 8a, 8b and the p-type region 3b are coupled through the gate oxide film 7. Thus, channels are created in the respective channel regions CH1 and CH2.

Since a channel at the channel region CH1 short circuits the first n-type emitter layer 4 and the second n-type emitter layer 5 while a channel at the channel region CH2 short circuits the second n-type emitter layer 5 and the n-type base layer 2, current is initiated between the anode electrode 12 and the cathode electrode 10.

The current (main current) is routed from the anode electrode 12 in sequence to the p-type anode layer 1, the n-type base layer 2, the channel region CH2, the second n-type emitter layer 5, the channel region CH1, the first n-type emitter layer 4 and the cathode electrode 10. Hence, a main current exceeding a certain current value gives rise to the thyristor effect which latches and turns on the four-layer structure formed by the p-type anode layer 1, the n-type base layer 2, the p-type base layer 3 and the second n-type emitter layer 5. As a result, the unit cell 100 turns on.

Once the turning on has occurred, most of the main current flows from the anode electrode 12 in sequence to the p-type anode layer 1, the n-type base layer 2, the p-type base layer 3, the second n-type emitter layer 5, the channel region CH1, the first n-type emitter layer 4 and the cathode electrode 10, leaving a little current to flow through the channel region CH2.

If the gate voltage is removed during such ON-operation, the charge stored in the channel regions CH1 and CH2 is discharged. While the discharge take places, the potential around the gate oxide film 7 exhibits an exponential-like fall, thereby extinguishing the channel short circuiting the first n-type emitter layer 4 and the second n-type emitter layer 5 and the channel short circuiting the second n-type emitter layer 5 and the n-type base layer 2. This blocks the main current in the channel region CH1 and turns off the unit cell 100 since the channel region CH2 carries a little current whereas the channel region CH1 carries most of the current in the ON-operation.

As described above, no problem will be created even if the four-layer structure (i.e., main thyristor) latches which is formed by the p-type anode layer 1, the n-type base layer 2, the p-type base layer 3 and the second n-type emitter layer 5. However, this is not observed where the main current has further grown and latched another four-layer structure (i.e., parasitic thyristor) which is formed by the p-type anode layer 1, the n-type base layer 2, the p-type base layer 3 and the first n-type emitter layer 4. If the parasitic thyristor has latched, a current does not flow through not only the channel region CH2 but also the channel region CH1, thereby making it impossible to turn off the parasitic thyristor by removing the gate voltage. Thus, the EST of FIG. 2 is likely to be destroyed as much as the IGBT of FIG. 1 is.

SUMMARY OF THE INVENTION

A self arc-extinguishing thyristor according to a first aspect comprises: (a) a body including:(a-1) a first conductivity type first semiconductor layer; (a-2) a second conductivity type second semiconductor layer formed on the first semiconductor layer; (a-3) a first conductivity type third semiconductor layer selectively formed in a top surface of the second semiconductor layer; (a-4) a second conductivity type fourth semiconductor layer selectively formed in a top surface of the third semiconductor layer; and (a-5) a second conductivity type fifth semiconductor layer selectively formed, spaced from the fourth semiconductor layer, in the top surface of the third semiconductor layer so that a bottom surface of the fifth semiconductor layer is farther from the second semiconductor layer than a bottom surface of the fourth semiconductor layer; (b) an insulation film disposed on a top surface of the body at least from the fourth to the fifth semiconductor layers; (c) a control electrode disposed in the insulation film so as to be in a faced relation with the third semiconductor layer; (d) a first electrode disposed in electrical connection with the third and the fifth semiconductor layers; and (e) a second electrode disposed in electrical connection with the first semiconductor layer.

In the first aspect of the device, the fourth semiconductor layer preferably surrounds the fifth semiconductor layer at the top surface of the body.

In the first aspect of the device, the fifth semiconductor layer preferably intercepts the top surface of the body in a ring shape and the third semiconductor layer preferably consists of: (a-3-1) a relatively heavily doped first portion which is surrounded by the fifth semiconductor layer at the top surface of the body; and (a-3-2) a relatively lightly doped second portion, the second portion together with the first portion completely occupying the third semiconductor layer.

In the first aspect of the device, the insulation film preferably includes (b-1) an additional portion which extends from the second semiconductor layer, which adjoins the top surface of the body, to the fourth semiconductor layer.

Thus, in the first aspect of device, since the third semiconductor layer has a large thickness between the second and the fifth semiconductor layers, a transistor formed by these semiconductor layers has a reduced current amplification factor.

A self arc-extinguishing thyristor according to a second aspect comprises: (a) a body including: (a-1) a first conductivity type first semiconductor layer having a relatively low impurity concentration; (a-2) a second conductivity type second semiconductor layer formed on the first semiconductor layer; (a-3) a first conductivity type third semiconductor layer selectively formed in a top surface of the second semiconductor layer; (a-4) a second conductivity type fourth semiconductor layer selectively formed in a top surface of the third semiconductor layer; (a-5) a second conductivity type fifth semiconductor layer selectively formed, spaced from the fourth semiconductor layer in the top surface of the third semiconductor layer; and (a-6) a relatively heavily doped first conductivity type sixth semiconductor layer selectively formed in the first semiconductor layer so as to face the fifth semiconductor layer through the second and the third semiconductor layers and so as to extend into the second semiconductor layer; (b) an insulation film disposed on a top surface of the body at least from the fourth semiconductor layer to the fifth semiconductor layer; (c) a control electrode disposed at least in the insulation film so as to be in a faced relation with the third semiconductor layer; (d) a first electrode disposed in electrical connection with the third and the fifth semiconductor layers; and (e) a second electrode disposed in electrical connection with the first and the sixth semiconductor layers.

In the second aspect of the device, the fourth semiconductor layer preferably surrounds the fifth semiconductor layer at the top surface of the body.

In the second aspect of the device, the fifth semiconductor layer preferably intercepts the top surface of the body in a ring shape and the third semiconductor layer preferably consists of: (a-3-1) a relatively heavily doped first portion which is surrounded by the fifth semiconductor layer at the top surface of the body; and (a-3-2) a relatively lightly doped second portion, the second portion together with the first portion completely occupying the third semiconductor layer.

In the second aspect of the device, the insulation film may include (b-1) an additional portion which extends from the second semiconductor layer, which adjoins the top surface of the body, to the fourth semiconductor layer.

Thus, in the second aspect of the device, since the sixth semiconductor layer facing the fifth semiconductor layer short circuits the second semiconductor layer and the second electrode, a transistor formed by the first to the third semiconductor layers has a reduced current amplification factor.

A self arc-extinguishing thyristor according to a third aspect comprises: (a) a body including: (a-1) a first conductivity type first semiconductor layer; (a-2) a second conductivity type second semiconductor layer formed on the first semiconductor layer so as to have at its top surface a recessed surface and a protrusion which projects upward from the recessed surface; (a-3) a first conductivity type third semiconductor layer selectively formed in a top surface of the second semiconductor layer so as to include at least the protrusion and a portion of the recessed surface which is contiguous to the protrusion; (a-4) a second conductivity type fourth semiconductor layer selectively formed in a top surface of the third semiconductor layer; and (a-5) a second conductivity type fifth semiconductor layer selectively formed in the top surface of the third semiconductor layer, spaced from the fourth semiconductor layer, in the protrusion so that a bottom surface of the fifth semiconductor layer is farther from the second semiconductor layer than a bottom surface of the fourth semiconductor layer; (b) an insulation film disposed on a top surface of the body at least from the fourth semiconductor layer to the fifth semiconductor layer; (c) a control electrode disposed at least in the insulation film so as to be in a faced relation with the third semiconductor layer; (d) a first electrode disposed in electrical connection with the third and the fifth semiconductor layers; and (e) a second electrode disposed in electrical connection with the first semiconductor layer.

In the third aspect of the device, a top surface of the fourth semiconductor layer is preferably below the bottom surface of the fifth semiconductor layer.

In the third aspect of the device, the fourth semiconductor layer preferably intercepts a surface of the body only at the recessed surface and side surfaces 10 of the protrusion.

In the third aspect of the device, the fifth semiconductor layer preferably intercepts the top surface of the protrusion in a ring shape and the third semiconductor layer preferably consists of: (a-3-1) a relatively heavily doped first portion which is surrounded by the fifth semiconductor layer at the top surface of the protrusion; and (a-3-2) a relatively lightly doped second portion, the second portion together with the first portion completely occupying the third semiconductor layer.

In the third aspect of the device, the insulation film may include (b-1) an additional portion which extends from the second semiconductor layer, which adjoins the top surface of the body, to the fourth semiconductor layer.

In the third aspect of the device, the control electrode is preferably electrically connected with the third semiconductor layer.

In the third aspect of the device, the third semiconductor layer preferably entirely contains, at the top surface of the second semiconductor layer, the protrusion and the recessed surface contiguous thereto.

In the third aspect of the device, the top surface of the protrusion projects upward from a top surface of the insulation film.

The device of the third aspect may further comprise a first external electrode which is in pressure contact with the first electrode.

The device of the third aspect may further comprise a second external electrode which is in pressure contact with the second electrode.

Thus, in the third aspect of the device, the third semiconductor layer is within the protrusion and the fifth semiconductor layer is disposed on the third semiconductor layer. In addition to this, since the bottom surface of the fifth semiconductor layer is far from the bottom surface of the fourth semiconductor layer, the effect as promised in the first aspect of the device is also ensured in the device of the third aspect.

A method of manufacturing a self arc-extinguishing thyristor according to a first aspect comprises the steps of: (a) forming a second conductivity type second semiconductor layer on a first conductivity type first semiconductor layer; (b) forming a first conductivity type third semiconductor layer at least selectively in a top surface of the second semiconductor layer; (c) forming a second conductivity type fourth semiconductor layer selectively in a top surface of the third semiconductor layer; (d) forming a second conductivity type fifth semiconductor layer selectively in the top surface of the third semiconductor layer, spaced from the fourth semiconductor layer, so that a bottom surface of the fifth semiconductor layer is farther from the second semiconductor layer than a bottom surface of the fourth semiconductor layer; (e) forming an insulation film on a top surface of the body at least from the fourth to the fifth semiconductor layers in such a manner that a control electrode is buried in the insulation film in a faced relation with the third semiconductor layer; (f) forming a first electrode in electrical connection with the third and the fifth semiconductor layers; and (g) forming a second electrode in electrical connection with the first semiconductor layer.

In the first aspect of the method, the step (a) may be substantially the step of (a-1) epitaxially growing the second semiconductor layer on the first semiconductor layer.

In the first aspect of the method, the step (a) may be substantially the step of (a-2) diffusing second conductivity type impurities into the first semiconductor layer.

In the first aspect of the method, the step (a) may be substantially the step of (a-3) bonding the second semiconductor layer to the first semiconductor layer.

In the first aspect of the method, the step (b) may substantially consists of the steps of: (b-1) growing a first oxide film having a first aperture on the second semiconductor layer; and (b-2) injecting first conductivity type first impurities into the second semiconductor layer which is masked by the first oxide film and thereby forming a first portion of the third semiconductor layer.

In the first aspect of the method, the injection of the first impurities is preferably ion implantation.

In the first aspect of the method, the injection of the first impurities may be followed by diffusion.

In the first aspect of the method, the step (c) preferably comprises the steps of: (c-1) growing on the second semiconductor layer a second oxide film having a second aperture which is wider than the first aperture and which therefore contains the first aperture; and (c-2) injecting first conductivity type second impurities into the second semiconductor layer which is masked by the second oxide film and thereby forming a second portion of the third semiconductor layer.

In the first aspect of the method, the first portion preferably has a higher impurity concentration than the second portion.

In the first aspect of the method, the step (d) may comprise the steps of: (d-1) growing on the second and the third semiconductor layers a third oxide film having a third aperture which is contained in the second aperture; and (d-2) injecting second conductivity type third impurities into the third semiconductor layer which is masked by the third oxide film.

In the first aspect of the method, the third aperture may be ring-shaped.

In the first aspect of the method, the step (e) preferably comprises the steps of: (c-1) growing a fourth oxide film which extends from the second to the fourth semiconductor layers and which entirely covers the fourth semiconductor layer and growing a fifth oxide film which covers the first portion; (e-2) forming a control electrode on the fourth oxide film; and (e-3) injecting second conductivity type fourth impurities into the third semiconductor layer which is masked by the fourth and the fifth oxide films and the control electrode.

In the first aspect of the method, the fifth semiconductor layer may be ring-shaped inside the fourth semiconductor layer.

The method of the third aspect may further comprise the step of (e-4) growing a sixth oxide film on a top and side surfaces of the control electrode and side surfaces of the fourth oxide film, wherein the insulation film substantially consists of the fourth and the sixth oxide films.

In the first aspect of the method, the step (f) may be substantially the step of (f-1) vacuum evaporating metal on the entire surface of a structure resulting from the steps (a) to (e).

In the first aspect of the method, the step (g) may be substantially the step of (g-1) vacuum evaporating metal on a bottom surface of the first semiconductor layer.

Thus, the first aspect of the method is suitable for fabrication of the self arc-extinguishing thyristor of the first aspect of the device.

In a second aspect of the method, the manufacturing method further comprises the step of (h) selectively thickening the third semiconductor layer to thereby form a protrusion which partially contains the fourth semiconductor layer at its side surfaces, the step (h) being executed after the step (c) and before the step (d).

In the second aspect of the method, the (h) preferably includes the steps of: (h-1) forming a second conductivity type sixth semiconductor layer on a top surface of a structure resulting from the steps (a) to (c); and (h-2) selectively removing the fourth and the sixth semiconductor layers. The top surface of the protrusion may be substantially occupied by the sixth semiconductor layer.

In the second aspect of the the method, the step (h-1) may be substantially the step of (h-1-1) epitaxially growing the sixth semiconductor layer on the top surface of the structure resulting from the steps (a) to (c).

In the second aspect of the method, the step (h-2) preferably involves removal of the second and the third semiconductor layers.

In the second aspect of the method, the step (h) may further comprise the step of (h-3) increasing the impurity concentration of the sixth semiconductor layer.

In the second aspect of the method, the step (d) preferably involves selective formation of the fifth semiconductor layer in the top surface of the protrusion.

In the second aspect of the method, the fifth semiconductor layer is preferably formed around the protrusion.

In the second aspect of the method, the fourth semiconductor layer may be formed to surround the protrusion.

In a third aspect of the method, the protrusion may be formed to be thicker than the insulation film.

The method of the third aspect may further comprise the step of (i) forming a first external electrode which is in pressure contact with the first electrode.

The method of the third aspect may further comprises the step of (j) forming a second external electrode which is in pressure contact with the second electrode.

In a fourth aspect of the method, the third semiconductor layer is preferably formed on the entire top surface of the second semiconductor layer in the step (b) and the control electrode is preferably disposed in electrical connection with the third semiconductor layer in the step (e).

The second- to the fourth-aspect of the method are suitable for fabrication of self arc-extinguishing thyristor of the third aspect of the device.

A method of manufacturing a self arc-extinguishing thyristor according to a fifth aspect comprises the steps of: (a) forming a second conductivity type second semiconductor layer of a relatively low impurity concentration on a first conductivity type first semiconductor layer; (b) forming a second conductivity type third semiconductor layer of a relatively high impurity concentration which extends from a bottom surface of the first semiconductor layer into the second semiconductor layer; (c) forming a first conductivity type fourth semiconductor layer selectively in a top surface of the second semiconductor layer; (d) forming a second conductivity type fifth semiconductor layer selectively in a top surface of the fourth semiconductor layer; (e) forming a second conductivity type sixth semiconductor layer selectively in the top surface of the fourth semiconductor layer so as to be in a spaced relation with the fifth semiconductor layer and in a faced relation with the third semiconductor layer; (f) forming an insulation film which extends from the fifth semiconductor layer to the sixth semiconductor layer in such a manner that a control electrode is buried in the insulation film in a faced relation with the fourth semiconductor layer; (g) forming a first electrode in electrical connection with the fourth and the sixth semiconductor layers; and (h) forming a second electrode in electrical connection with the first and the third semiconductor layers.

In the fifth aspect of the method, the sixth semiconductor layer is preferably formed in the shape of a ring at the top surface of the fourth semiconductor layer in the step (e).

In the fifth aspect of the method, the fifth semiconductor layer is preferably formed in the shape of a ring at the top surface of the fourth semiconductor layer outside the sixth semiconductor layer in the step (d).

In the fifth aspect of the method, the insulation film may be grown to extend from the third semiconductor layer to the fifth semiconductor layer.

In the fifth aspect of the method, the step (c) may comprise the steps of: (c-1) forming a relatively heavily doped first portion of the fourth semiconductor layer in the top surface of the second semiconductor layer in a faced relation with the third semiconductor layer; and (c-2) forming a relatively lightly doped second portion of the fourth semiconductor layer which, together with the first portion, completely occupies the fourth semiconductor layer.

The fifth aspect of the method is suitable for fabrication of the self arc-extinguishing thyristor of the second aspect of the device.

Thus, the self arc-extinguishing thyristors according to the present invention see less chance of latching of the parasitic thyristor which is formed by the first to the third and the fifth semiconductor layers, thereby allowing increased control of a larger main current and hence more reliable prevention of destruction of the device associated with the latching.

The manufacturing methods heretofore described are suitable for fabricating the self arc-extinguishing thyristors of the present invention.

Accordingly, it is an object of the present invention to offer a self arc-extinguishing thyristor in which a large main current is ensured.

These and other objects, features, aspects and advantages of the present invention will become more apparent from the following detailed description of the present invention when taken in conjunction with the accompanying drawings.

DESCRIPTION OF THE PREFERRED EMBODIMENTS

< Preferred Embodiment 1 >

Figure 1:
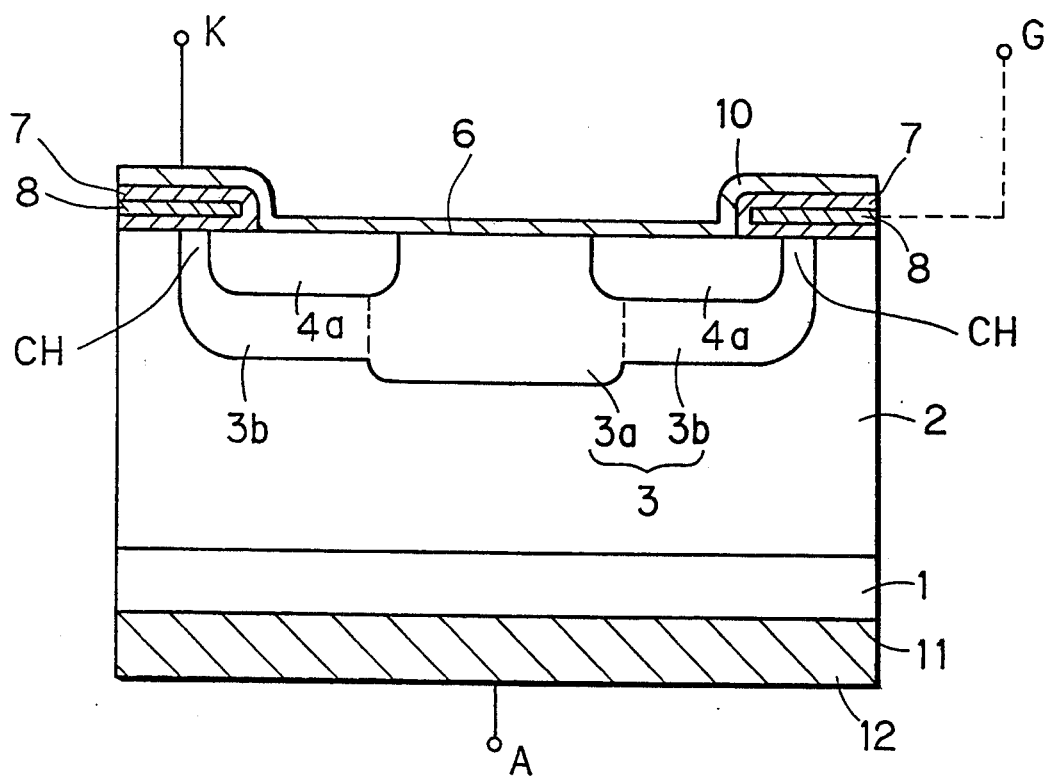
FIG. 1 is a cross sectional view showing a conventional IGBT structure.
Figure 2:
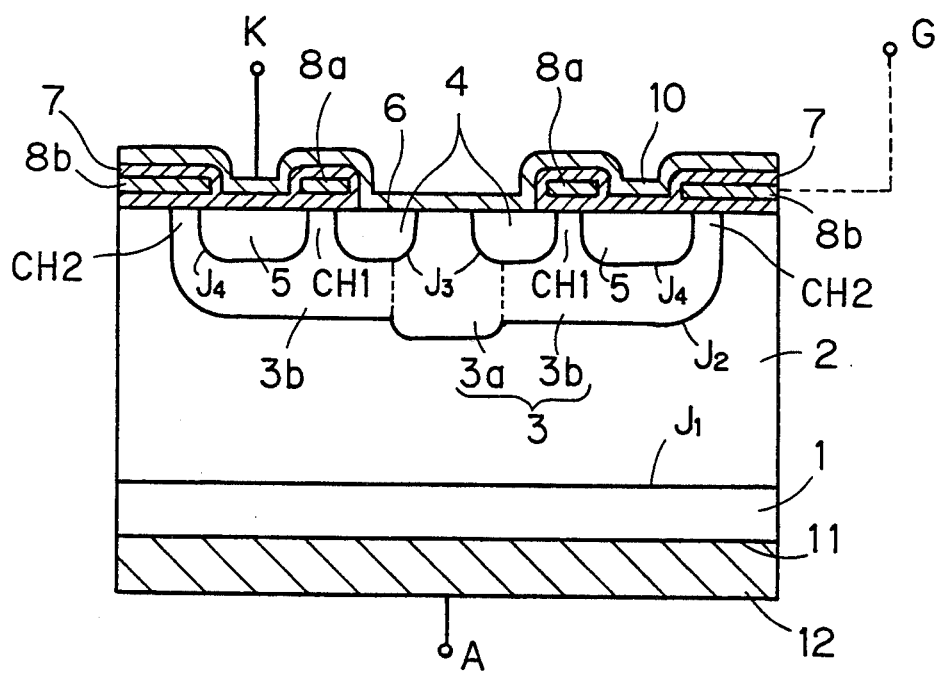
FIG. 2 shows a cross sectional structures of a conventional EST unit cell.
Figure 3A:
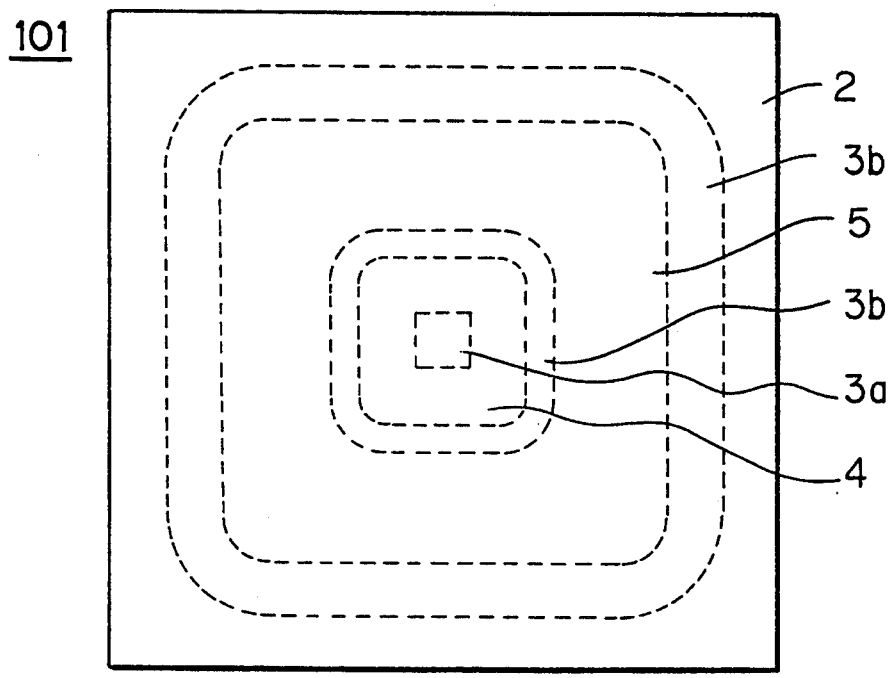
FIGS. 3A and 3B show a plan view and a cross sectional structures according to a first preferred embodiment of the present invention.
Figure 3B:
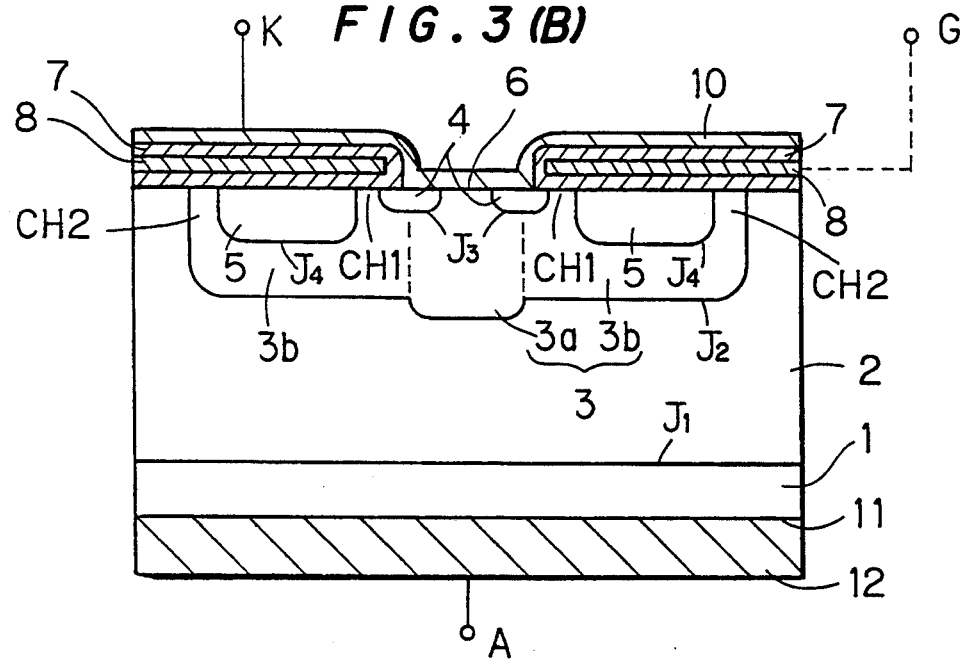

FIGS. 3A and 3B show a cross sectional structure of an EST unit cell 101 according to a first preferred embodiment of the present invention. The first preferred embodiment corresponds to a self arc-extinguishing thyristor of the first aspect of the invention.

An n-type base layer 2 is formed on a p-type anode layer 1. A pn junction $J_1$ is created at an interface between the p-type anode layer 1 and the n-type base layer 2. In a top center portion of the cell 101 of the n-type base layer 2, a p-type base layer 3 is selectively formed which consists of a relatively heavily doped p+-type center region 3a and a p-type region 3b surrounding the p+-type region 3a. The n-type base layer 2 forms a pn junction $J_2$ at its interface with the p-type base layer 3.

A first n-type emitter layer 4 and a second n-type emitter layer 5 are selectively formed in a top portion of the p-type base layer 3 so that the first n-type emitter layer 4 is surrounded by the second n-type emitter layer 5. The p-type base layer 3 forms a pn junction $J_3$ at its interface with the first n-type emitter layer 4 and another pn junction $J_4$ at its interface with the second n-type emitter layer 5.

Since the first n-type emitter layer 4 is thinner than the second n-type emitter layer 5, a distance between the pn junctions $J_3$ and $J_2$ is larger than a distance between the pn junctions $J_4$ and and $J_2$.

Two channel regions are formed in the vicinity of the top surface of the p-type region 3b, one between the first n-type emitter layer 4 and the second n-type emitter layer 5, i.e., a first channel region CH1, and the other between the second n-type emitter layer 5 and the n-type base layer 2, i.e., a second channel region CH2. A gate electrode 8 buried in a gate oxide film 7 lies over the channel regions CH1 and CH2 and areas around the same. The gate electrode 8 is electrically connected with an external gate electrode G.

A top surface portion of the first n-type emitter layer 4 and the top surface of the p+-type region 3a form a cathode surface 6. The cathode surface 6 and the gate oxide film 7 arc covered with a cathode electrode 10. Hence, the gate electrode 8 and the second n-type emitter layer 5 arc each insulated from the cathode electrode 10 by the gate oxide film 7. On the other hand, the p-type base layer 3 and the first n-type emitter layer 4 electrically contact each other through the cathode electrode 10. The cathode electrode 10 is electrically connected with an external cathode electrode K.

An anode electrode 12 is disposed entirely across the bottom surface of the p-type anode layer 1, or an anode surface 11, so that the p-type anode layer 1 and the anode electrode 12 are in electrical contact with each other. The anode electrode 12 is connected with an external anode electrode A.

In an EST pellet, a plurality of the EST unit cells 101 are arranged and integrated parallel with each other in a matrix. The gate electrodes 8, the cathode electrodes 7 and the anode electrodes 10 of the respective unit cells 101 are electrically connected with each other.

For instance, the gate electrode 8 of each cell 101 is connected with the gate electrode 8 of a neighboring cell 101. The gate electrodes 8 as a whole and the external gate electrode G are connected with each other by an aluminum or other suitable wire. The anode electrodes 12 of the respective cells are brazed or otherwise connected to the external anode electrode A. The cathode electrodes 10 of the respective cells are also connected with each other. Electrical connection between the electrodes 10 as a whole and the external cathode electrode K is ensured by an aluminum wire and the like.

In the following, behavior of the unit cell 101 will be described. First, assume that the gate electrode 8 is kept at the same potential as the cathode electrode 10 and the anode electrode 12 is kept at a higher potential than the cathode electrode 10. In this case, since the pn junction $J_2$ is reversely biased, no current is initiated between the anode electrode 12 and the cathode electrode 10.

Next, assume that the anode electrode 12 is maintained at a higher potential than the cathode electrode 10 and the gate electrode 8 is also maintained at a higher potential than the cathode electrode 10. In this case, charge storage occurs in the gate electrode 8 and the channel regions CH1 and CH2 since the p-type region 3b is electrically connected with the cathode electrode 10 through the p+-type region 3a while the gate electrode 8 and the p-type region 3b are coupled through the gate oxide film 7. Thus, channels are created in the respective channel regions CH1 and CH2.

Since a channel at the channel region CH1 short circuits the first n-type emitter layer 4 and the second n-type emitter layer 5 while a channel at the channel region CH2 short circuits the second n-type emitter layer 5 and the n-type base layer 2, current is initiated between the anode electrode 12 and the cathode electrode 10.

The main current flows from the anode electrode 12 in sequence to the p-type anode layer 1, the n-type base layer 2, the channel region CH2, the second n-type emitter layer 5, the channel region CH1, the first n-type emitter layer 4 and the cathode electrode 10. Hence, if the main current exceeds a certain value, the thyristor effect occurs which latches and turns on a four-layer structure formed by the p-type anode layer 1, the n-type base layer 2, the p-type base layer 3 and the second n-type emitter layer 5, eventually activating the unit cell 101.

Once the unit cell 101 has turned on, most of the main current flows from the anode electrode 12 in sequence to the p-type anode layer 1, the n-type base layer 2, the p-type base layer 3, the second n-type emitter layer 5, the channel region CH1, the first n-type emitter layer 4 and the cathode electrode 10. Thus, only a little current flows through the channel region CH2.

Removal of the gate voltage during this ON-operation causes discharge of the charge stored in the channel regions CH1 and CH2, in the process of which the potential around the gate oxide film 7 exponentially decreases. This extinguishes the channel short circuiting the first n-type emitter layer 4 and the second n-type emitter layer 5 and the channel short circuiting the second n-type emitter layer 5 and the n-type base layer 2. Since the channel region CH2 carries a little current while the channel region CH1 carries most of the current during the ON-operation, the main current, a primary component of the current, is blocked in the channel region CH2, thereby turning off the unit cell 101.

As described above, no problem will be caused even if the four-layer structure (i.e., main thyristor) latches which is formed by the p-type anode layer 1, the n-type base layer 2, the p-type base layer 3 and the second n-type emitter layer 5, which is the same as in the conventional EST unit cell.

Likewise the conventional unit cell, the unit cell 101 includes a four-layer structure (i.e., parasitic thyristor) which is formed by the p-type anode layer 1, the n-type base layer 2, the p-type base layer 3 and the first n-type emitter layer 4. However, the unit cell 101 is different from the conventional unit cell in that the distance between the pn junctions $J_3$ and $J_2$ is larger than the distance between the pn junctions $J_4$ and $J_2$. Due to this characteristic geometry, a transistor formed by the n-type base layer 2, the p-type base layer 3 and the first n-type emitter layer 4, which a part of the parasitic thyristor, has a smaller current amplification factor than a transistor formed by the n-type base layer 2, the p-type base layer 3 and the second n-type emitter layer 5, which a part of the main thyristor. Hence, the unit cell 101 sees less chance of latching of the parasitic thyristor than the conventional EST unit cell, preventing destruction of the device associated with latching of the parasitic thyristor.

FIGS. 4 to 10 show a manufacturing method of the unit cell 101. The illustrative manufacturing method corresponds to a manufacturing method of a self arc-extinguishing thyristor of the first aspect of the present invention.

Figure 4:
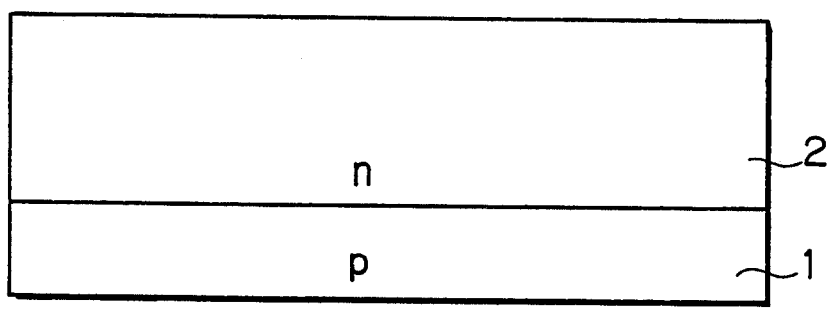
FIGS. 4 to 10 are cross sectional views of the structure of FIG. 3 during successive stages in its manufacturing process.

A first step of fabrication is formation of the n-type base layer 2 on the p-type anode layer 1 by epitaxial growth, diffusion or bonding (FIG. 4).

Figure 5:
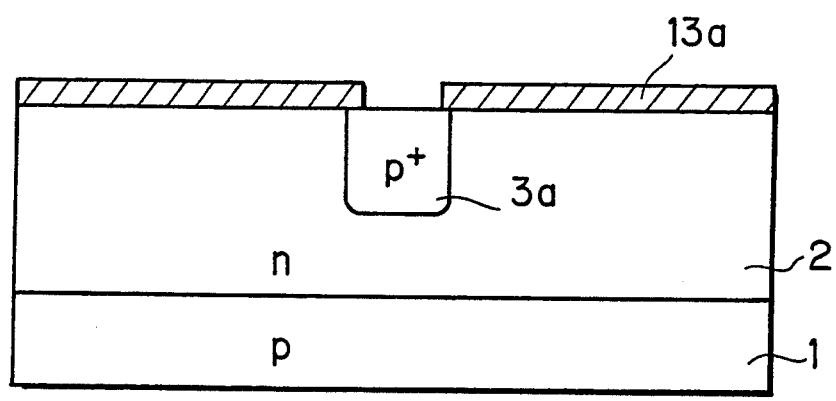

Following this, an oxide film 13a which serves as a mask is selectively formed on the n-type base layer 2, and the p+-type region 3a is implanted or diffused through an aperture of the oxide film 13a (FIG. 5).

Figure 6:
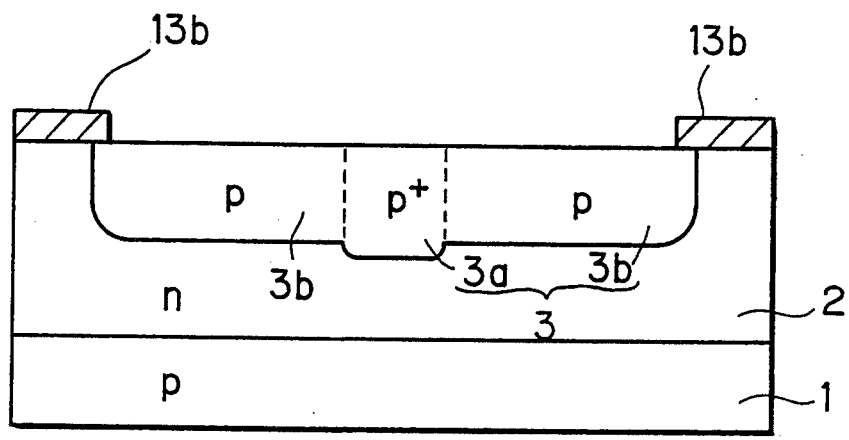

The oxide film 13a is then removed and an oxide film 13b having a wider aperture than the oxide film 13a is selectively grown on the n-type base layer 2. The p-type region 3b is implanted or diffused through the aperture of the oxide film 13b, thereby completing the p-type base layer 3 (FIG. 6).

Figure 7:
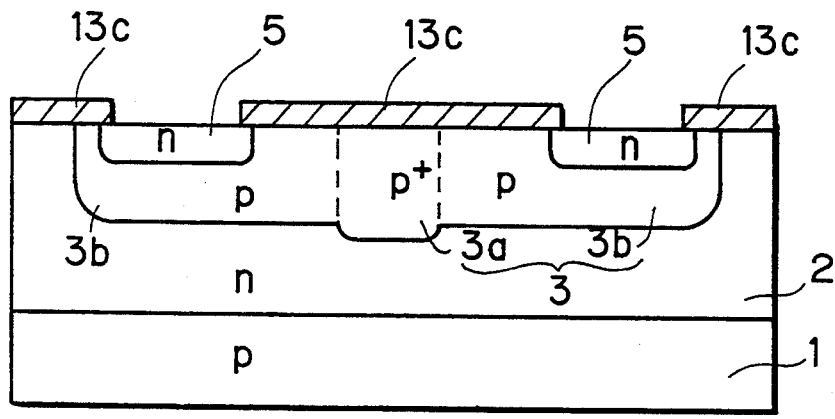

The oxide film 13b is thereafter removed and an oxide film 13c is selectively grown on the n-type base layer 2 and the p-type base layer 3. The oxide film 13c has a narrower aperture than the oxide film 13b and completely covers the p+-type region 3a. The second n-type emitter layer 5 is implanted or diffused through the aperture of the oxide film 13c (FIG. 7).

Next, the oxide film 13c is removed, and an oxide film 7a is selectively formed on the second n-type emitter layer 5 which has an aperture narrower than the oxide film 13c itself. An oxide film 13d is selectively grown on the p+-type region 3a and a portion of the p-type region near the p+-type region 3a. The gate electrode 8 is then formed on the oxide film 7a. The gate electrode 8 may be made of polysilicon.

Figure 8:
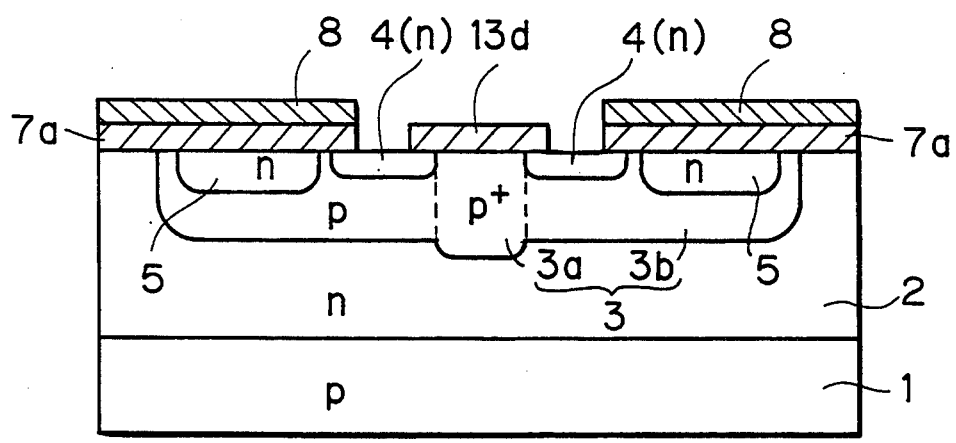

The first n-type emitter layer 4 is then implanted or diffused through the aperture of the oxide films 7a and 13d (FIG. 8).

Figure 9:
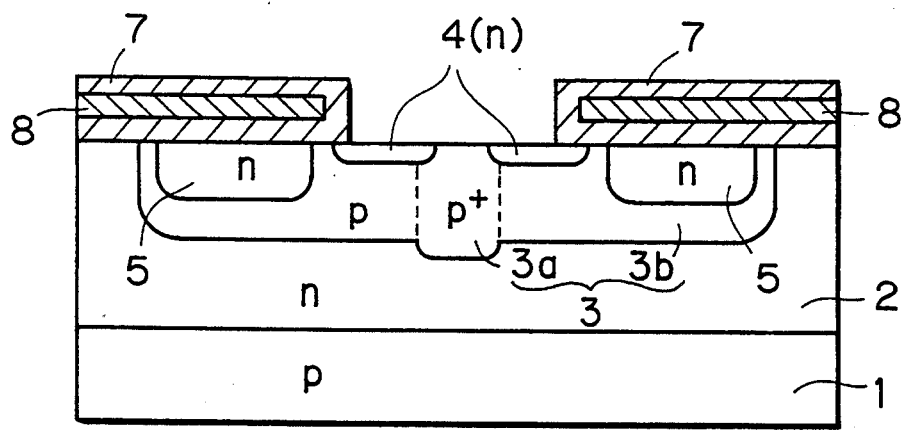

In a next stage, side walls of the oxide film 7a and side and top surfaces of the gate electrode 8 are covered with an oxide film, whereby the gate electrode 8 is buried in the gate oxide film 7 (FIG. 9).

Figure 10:
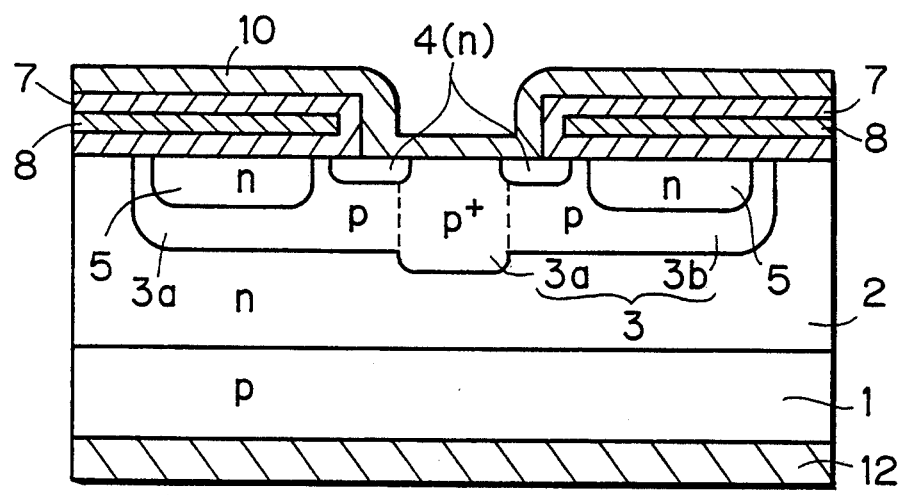

By forming the cathode and the anode electrodes 10 and 12 by a known technique such as vacuum evaporation of aluminum, fabrication of the unit cell 101 completes (FIG. 10).

<Preferred Embodiment 2>

FIGS. 11A and 11B show a cross sectional structure of an EST unit cell 102 according to a second preferred embodiment of the present invention. The second preferred embodiment corresponds to a self arc-extinguishing thyristor of the third aspect of the invention.

The unit cell 102 is comprised of a semiconductor body and electrodes sandwiching the same. Silicon is used for a base member of the semiconductor body. The bottom most portion of the semiconductor body is occupied by a p-type anode layer 1 so that the p-type anode layer 1 is exposed to the bottom surface of the semiconductor body, or an anode surface 11. Across the top surface of the p-type anode layer 1, an n-type base layer 2 is disposed which selectively includes in its top surface a p-type base layer 3. The p-type base layer 3 consists of a relatively heavily doped p+-type center region 3a and a p-type region 3b which surrounds the p+-type region 3a at the top surface of the semiconductor body. The n-type base layer 2 forms a pn junction $J_1$ at its interface with the p-type anode layer 1 and a pn junction $J_2$ at its interface with the p-type base layer 3.

The semiconductor body has a recessed surface 6b from which a protrusion projects upward. The protrusion has a top surface 6a and side surface 6c. The top surface 6a serves as a cathode surface. The p+-type region 3a and the p-type region 3b are partially included in the protrusion.

A second n-type emitter layer 5 and a first n-type emitter layer 4 are selectively formed in space in the p-type base layer 3 in such a manner that the second n-type emitter layer 5 adjoins the recessed and the side surfaces 6b and 6c while the first n-type emitter layer 4 adjoins the top and the side surfaces 6a and 6c.

A pn junction $J_3$ is created at an interface between the first n-type emitter layer 4 and the p-type base layer 3. A pn junction $J_4$ is created at an interface between the second n-type emitter layer 5 and the p-type base layer 3.

The pn junction $J_3$ intercepts the side surface 6c at an end and the top surface 6a at the other end while the pn junction $J_4$ intercepts the side surface 6c at an end and the recessed surface 6b at the other end.

In the unit cell 102 tailored as above, a channel region CH1 is realized at a portion of the p-type base layer 3 which resides between the side surface 6c of the protrusion and a channel region CH2 is realized at a portion of the p-type base layer 3 which resides below the recessed surface 6b. The recessed and the side surfaces 6b and 6c are covered with a gate oxide film 7 in which a gate electrode 8 is buried.

The gate electrode 8 buried in the gate oxide film 7 is in a faced relation with the portions of the first n-type emitter layer 4 adjoining the side surface 6c, the channel region CH1, the exposed surface of the second n-type emitter layer 5, the channel region CH2 and the exposed surface of the n-type base layer 2. Due to the existence of the gate oxide film 7, the parts of the semiconductor body listed immediately above are electrically insulated from the gate electrode 8.

A cathode electrode 10 is disposed to entirely cover the semiconductor body and the gate oxide film 7. Since the cathode electrode 10 is in contact with the p-type base layer 3 and the first n-type emitter layer 4 at the top surface 6a of the protrusion, the p-type base layer 3 and the first n-type emitter layer 4 are electrically connected with each other.

An anode electrode 12 is disposed across the bottom surface of the p-type anode layer 1, or the anode surface 11, thereby electrically connecting the p-type anode layer 1 and the anode electrode 12.

A plurality of such EST unit cells 102 are arranged and integrated parallel with each other in a matrix so that an EST pellet is formed, which is similar to the first preferred embodiment. The gate electrodes 8 of the respective unit cells 102 are electrically connected with each other on the pellet and further with the external gate electrode G. The cathode electrodes 7 of the respective unit cells 102 are electrically connected with each other in a similar manner. The anode electrodes 10 of the respective unit cells 102 are contiguous to each other.

Principles of turn-on turn-off control of the EST unit cell 102 remain the same as those of the EST unit cell 101 of the first preferred embodiment. That is, the unit cell 102 is turned on by keeping the anode electrode 12 and the gate electrode 8 each at a higher potential than the cathode electrode 10, and turned off by removing the gate voltage applied to the gate electrode 8.

Similarly to the conventional unit cell, the unit cell 102 of the second preferred embodiment includes a four-layer structure (i.e., main thyristor) which is formed by the p-type anode layer 1, the n-type base layer 2, the p-type base layer 3 and the second n-type emitter layer 5 and another four-layer structure (i.e., parasitic thyristor) which is formed by the p-type anode layer 1, the n-type base layer 2, the p-type base layer 3 and the first n-type emitter layer 4. However, since the unit cell 102 requires that the first n-type emitter layer 4 is formed above the second n-type emitter layer 5 and hence the pn junction $J_3$ is located above the pn junction $J_4$, a transistor formed by the n-type base layer 2, the p-type base layer 3 and the first n-type emitter layer 4, which are a part of the parasitic thyristor, has a smaller current amplification factor than a transistor formed by the n-type base layer 2, the p-type base layer 3 and the second n-type emitter layer 5, which are a part of the main thyristor. Hence, the unit cell 102 of the second preferred embodiment shares with the first preferred embodiment the same effect that the parasitic thyristor is less likely to be latched than in the conventional device.

The second preferred embodiment has an advantage over the first preferred embodiment. Since the first and the second n-type emitter layers 4 and 5 are disposed in an overlapping relation in a direction of their thicknesses, the top surface of the semiconductor body is effectively utilized and a current capacity per unit area is enhanced.

Figure 12:
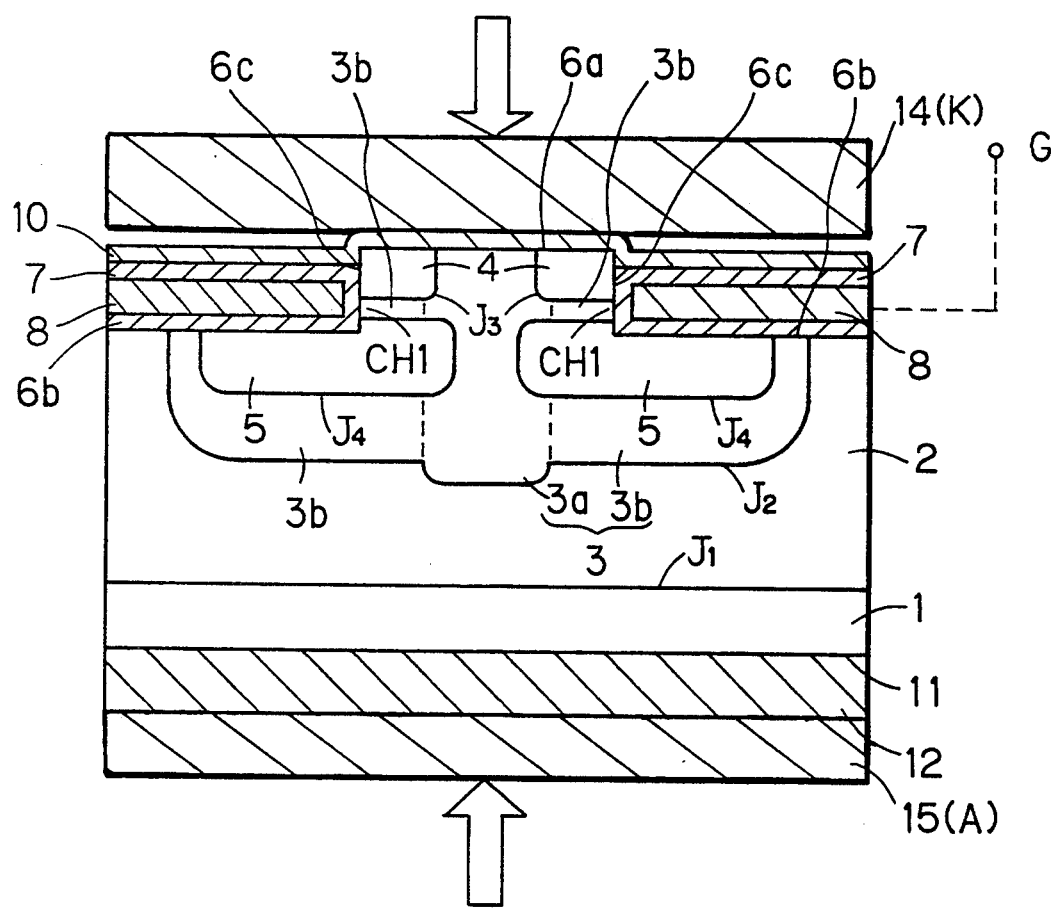
FIG. 12 is a cross sectional view showing a modification of the second preferred embodiment.

The unit cell of the second preferred embodiment may have the protrusion which outsoars the gate oxide film 7 as shown in FIG. 12. In such a modification, the gate oxide film 7 will not be damaged even if a cathode electrode body 14 and an anode electrode body 15 are disposed in pressure contact with the unit cell 102. By use of the cathode and the anode electrode bodies 14 and 15, heat created at device operations is effectively dissipated from the two sides of the unit cell 102 through the cathode and the anode electrode bodies 14 and 15.

Figure 11:
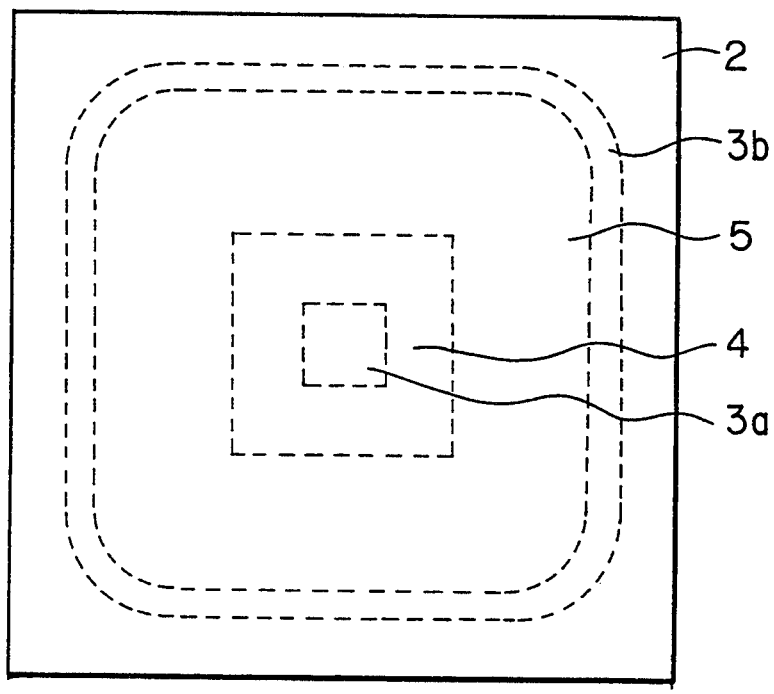
FIGS. 11A and 11B show a plan view and a cross sectional structures according to a second preferred embodiment of the present invention.
Figure 11:
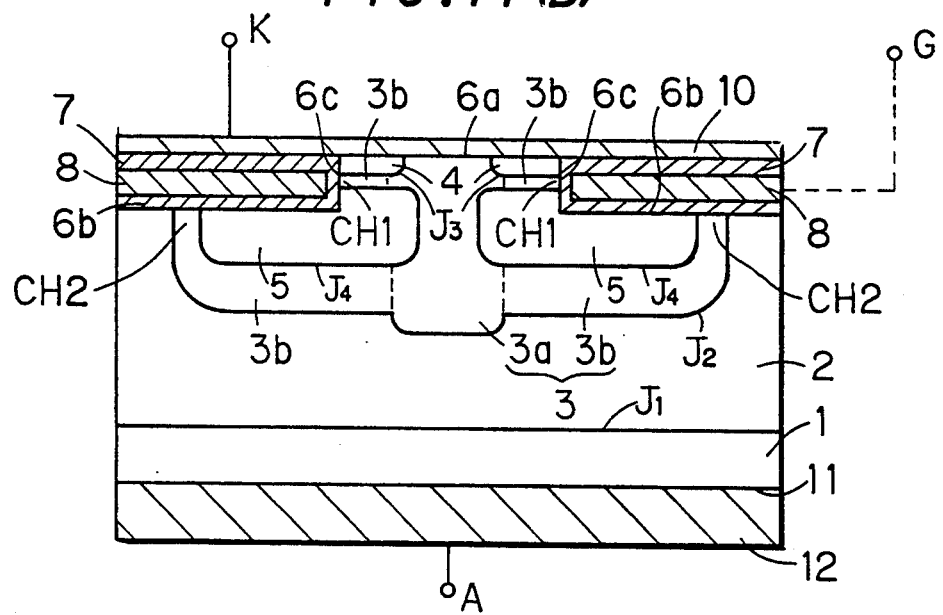

A manufacturing method of the structure of FIG. 11 is shown in FIGS. 13 to 18. The illustrative manufacturing method corresponds to a manufacturing method of a self arc-extinguishing thyristor of the second aspect of the invention.

Figure 13:
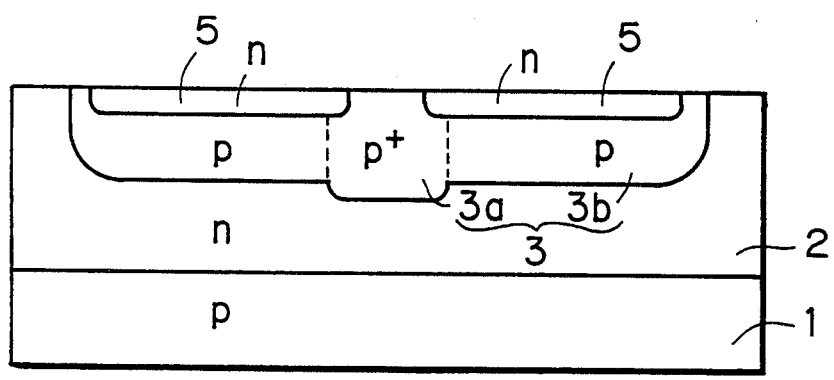
FIGS. 13 to 18 are views of the structure of FIG. 11A and 11B during successive stages in its manufacturing process.

First, the p-type anode layer 1, the n-type base layer 2, the p-type base layer 3 and the second n-type emitter layer 5 are formed through the same process steps as those illustrated in FIGS. 4 to 7 (FIG. 13).

Next, on the entire surface of the resultant structure, a p-type layer 31 is epitaxially grown (FIG. 14) which is etched except at a region which lies on both the p+-type region 3a and a portion of the p-type region 3b near the p+-type region 3a until the n-type base layer 2 is exposed. As a result, the recessed surface 6b is defined (FIG. 15). The gate electrode 8 buried in the gate oxide film 7 is then formed on the recessed surface 6b (FIG. 16).

Figure 17:
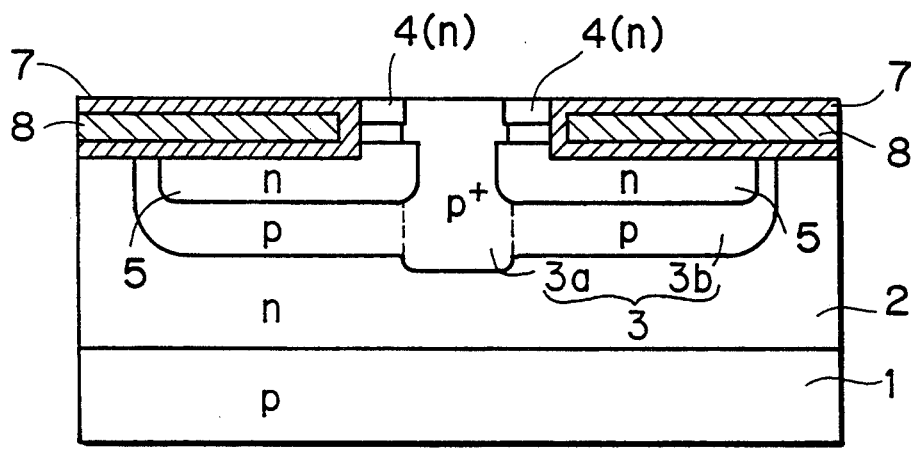

Following this, the p-type layer 31 is integrated with the p+-type region 3a by ion implantation of diffusion, whereby the first n-type emitter layer 4 is defined (FIG. 17).

Figure 18:
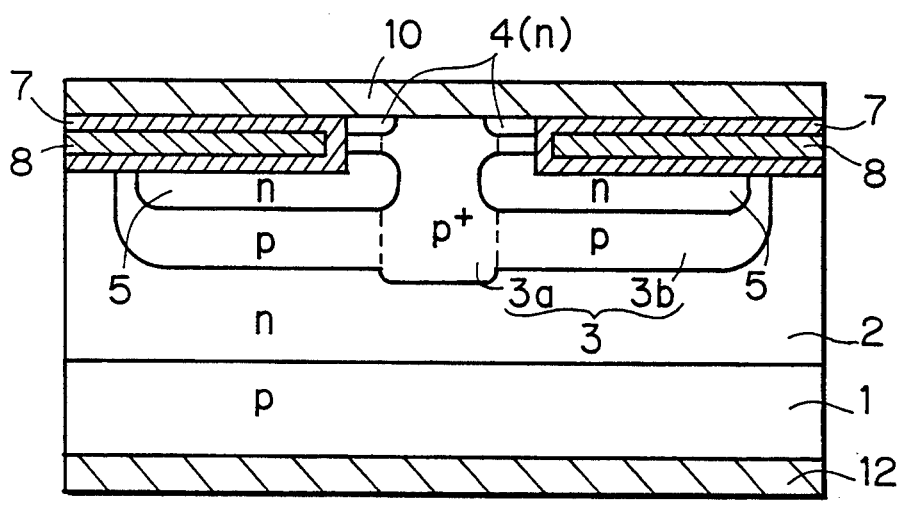

By forming the cathode and the anode electrodes 10 and 12 through the process step shown in FIG. 10, e.g., by vacuum evaporation of aluminum or other known technique, fabrication of the unit cell 102 completes (FIG. 18).

A manufacturing method of the structure illustrated in FIG. 12 is shown in FIGS. 19 to 23. The illustrative manufacturing method corresponds to a manufacturing method of a self arc-extinguishing thyristor of the third aspect of the invention.

Figure 19:
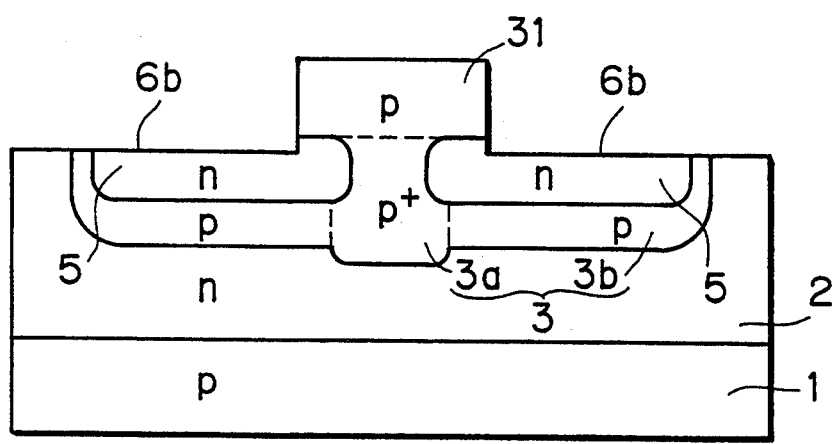
FIGS. 19 to 22 are views of the structure of FIG. 12 during successive stages in its manufacturing process.

The structure of FIG. 12 is processed in a similar manner to the fabrication of the structure of FIG. 11 up to the stage shown in FIG. 15 where the p-type anode layer 1, the n-type base layer 2, the p-type base layer 3, the second n-type emitter layer 5 and the p-type layer 31 are completed so that the recessed surface 6b is defined (FIG. 19).

Figure 20:
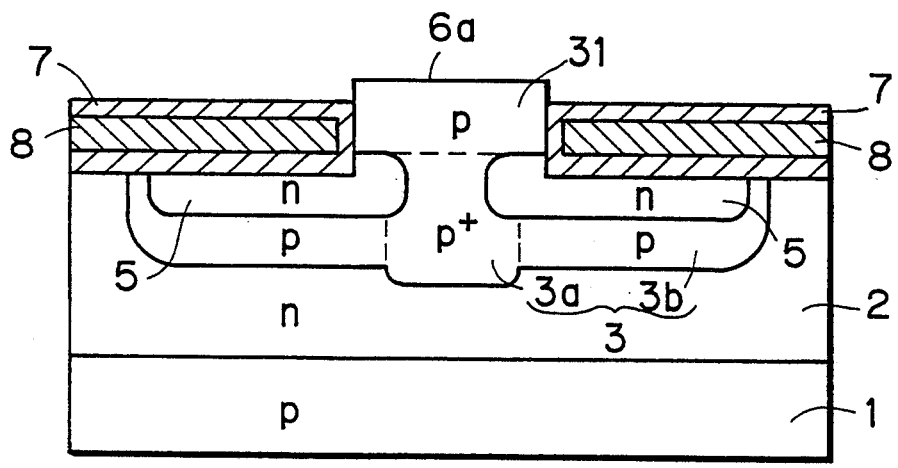

Then, a treatment as that shown in FIG. 16 is performed to bring about a similar result that the gate electrode 8 buried in the gate oxide film 7 is formed on the recessed surface 6b. To obtain the structure of FIG. 12, however, the top surface 6a of the protrusion needs to be formed so as to project upward beyond the top surface of the gate oxide film 7 (FIG. 20).

Figure 21:
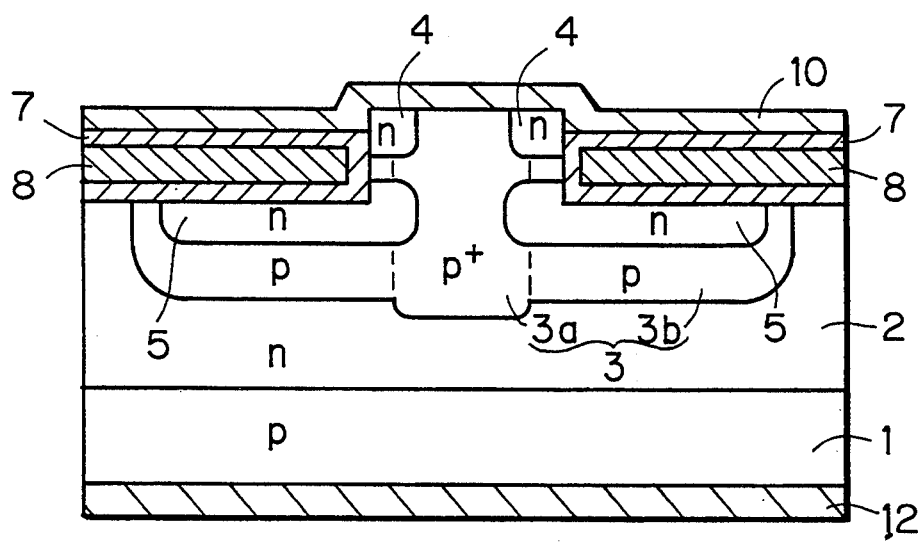

Next, the p-type layer 31 is integrated with the p+-type region 3a through process steps as shown in FIGS. 17 and 18. As a result, the first n-type emitter layer 4 is defined and the cathode and the anode electrodes 10 and 12 are formed (FIG. 21).

Figure 22:
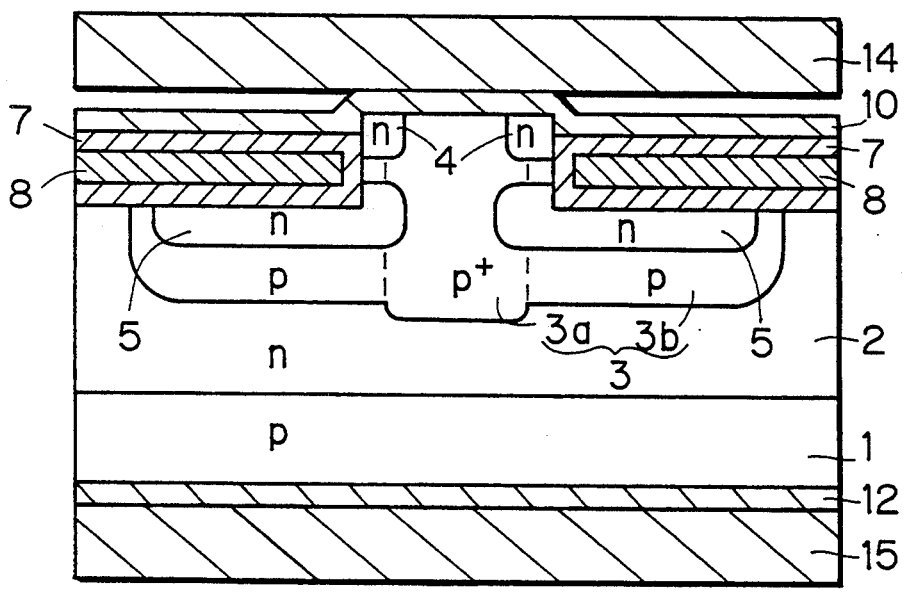

Following this, the cathode electrode body 14 is attached to the cathode electrode 10 in pressure contact and the anode electrode body 15 is attached to the anode electrode 12 in pressure contact (FIG. 22).

<Preferred Embodiment 3>

Figure 23A:
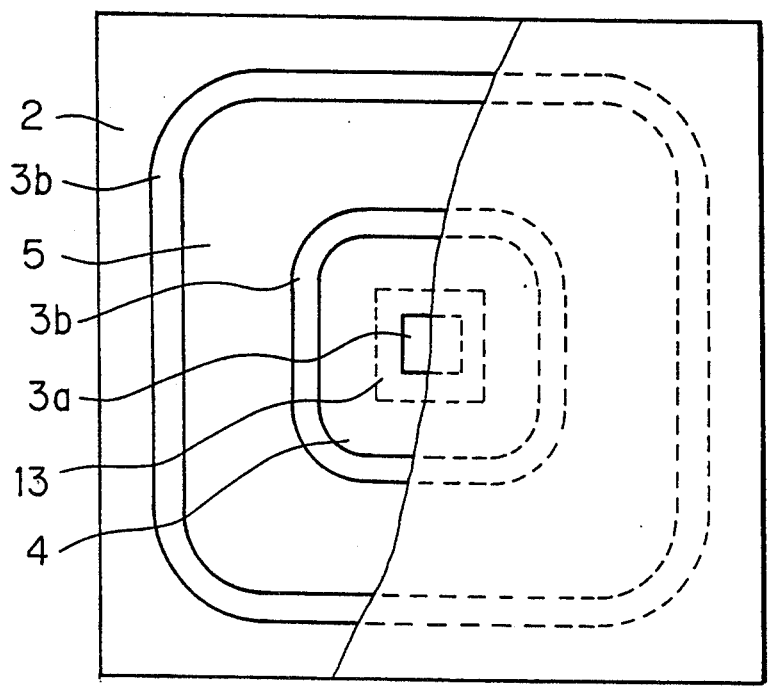
FIGS. 23A and 23B show a plan view and a cross sectional structures according to a third preferred embodiment of the present invention.
Figure 23B:
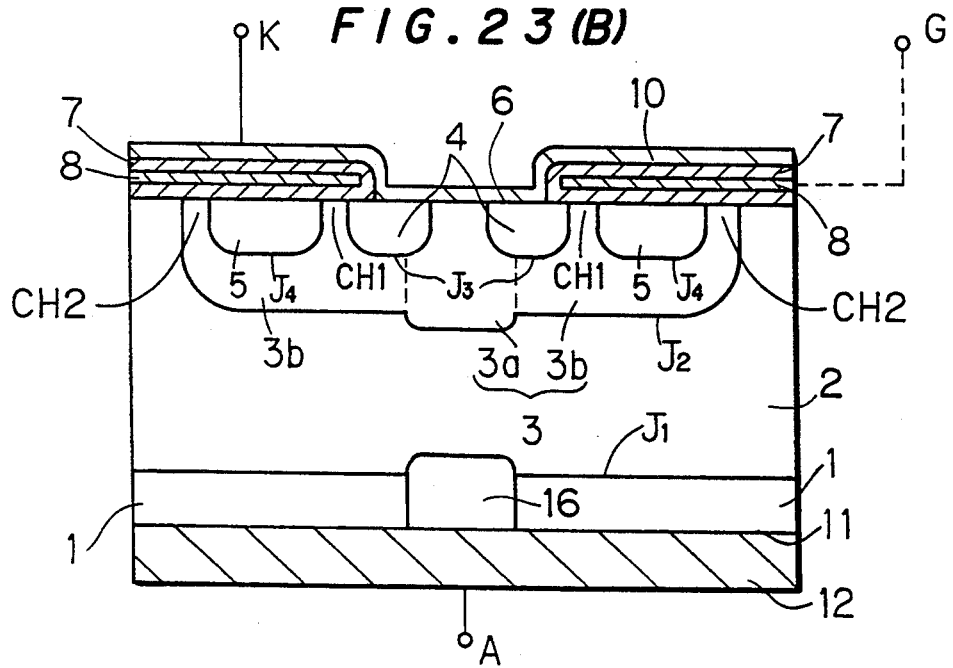
Figure 24:
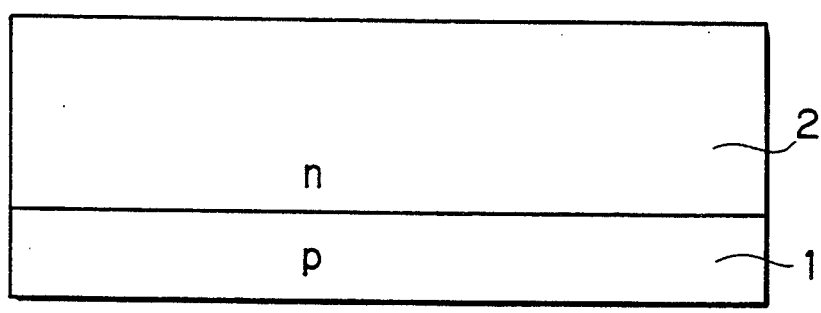
FIGS. 24 and 25 are views of the structure of FIG. 23 during successive stages in its manufacturing process.
Figure 25:
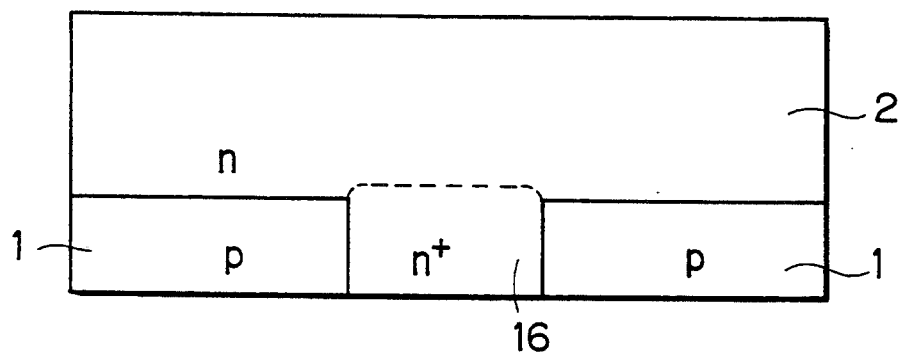

FIGS. 23A and 23B shows a plan view and a cross sectional structure of an EST unit cell 104 according to a third preferred embodiment of the present invention. The third preferred embodiment corresponds to a self arc-extinguishing thyristor of the second aspect of the invention.

The unit cell 104 is comprised of a semiconductor body and electrodes sandwiching the same. Silicon is a base member of the semiconductor body. The bottom most portion of the semiconductor body is occupied by a p-type anode layer 1 so that the p-type anode layer 1 is exposed to the bottom surface of the semiconductor body, or an anode surface 11. Across the top surface of the p-type anode layer 1, an n-type base layer 2 is disposed which selectively includes in its top surface a p-type base layer 3. The p-type base layer 3 consists of a relatively heavily doped p+-type center region 3a and a p-type region 3b which surrounds the p+-type region 3a at the top surface of the semiconductor body. The top surface of the semiconductor body serves as a cathode surface 6.

The n-type base layer 2 forms a pn junction $J_1$ at its interface with the p-type anode layer 1 and a pn junction $J_2$ at its interface with the p-type base layer 3.

A second n-type emitter layer 5 and a first n-type emitter layer 4 are selectively formed, spaced in a top portion of the p-type base layer 3 in such a manner that the first n-type emitter layer 4 is surrounded by the second n-type emitter layer 5. A portion of the first n-type emitter layer 4 and a portion of the p+-type region 3a form the cathode surface 6. A pn junction $J_3$ is created at an interface between the first n-type emitter layer 4 and the p-type base layer 3. A pn junction $J_4$ is created at an interface between the second n-type emitter layer 5 and the p-type base layer 3. The third preferred embodiment stands distinguished from the first and the second preferred embodiments in that the pn junction $J_3$ may not be located above the pn junction $J_4$.

The bottom surface of the p-type anode layer 1 is the anode surface 11. A relatively heavily doped n+-type region 16 intercepts the anode surface 11 and penetrates the p-type anode layer 1 into the n-type base layer 2 in a faced relation with the first n-type emitter layer 4 and the p+-type region 3a.

An anode electrode 12 is disposed on the anode surface 11 to electrically connect the p-type anode layer 1, the n+-type region 16 and the anode electrode 12. The anode electrode 12 is further connected with an external anode electrode A.

Principles of turn-on turn-off control of the EST unit cell 104 remain the same as those of the conventional EST unit cell 100. More precisely, the unit cell 104 is turned on by keeping the anode electrode 12 and the gate electrode 8 each at a higher potential than the cathode electrode 10, and turned off by removing the gate voltage applied to the gate electrode 8.

The unit cell 104 of the third preferred embodiment, however, has a striking difference from the conventional unit cell 100 that no carrier flux from the p-type anode layer 1 to the n-type base layer 2 will be created since the p-type anode layer 1 and the n-type base layer 2 are short circuited by the n+-type region 16.

A transistor formed by the p-type anode layer 1, n-type base layer 2 and the p-type base layer 3, which are a part of a parasitic thyristor, has a reduced current amplification factor. Hence, similarly to the first and the second preferred embodiments, the unit cell 104 of the third preferred embodiment promises the same effect that the parasitic thyristor is less likely to be latched.

It is to be noted that the effect of the present invention is even more enhanced in the unit cells of the first and the second preferred embodiments as modified to include the n+-type region 16.

A manufacturing method of the self arc-extinguishing thyristor having the n+-type region 16 is shown in FIGS. 24 to 27. The illustrative manufacturing method corresponds to a manufacturing method of a self arc-extinguishing thyristor of the fifth aspect of the invention.

Through process step as shown in FIG. 4, the p-type anode layer 1 and the n-type base layer 2 are formed (FIG. 24), followed by selective coverage of the p-type anode layer 1 by an oxide film (not shown) and subsequent ion implantation or diffusion which creates the n+-type region 16. Then, the structure is processed in a similar manner to those shown in FIGS. 5 to 10 so that the unit cell 104 of FIG. 23 is fabricated in which the W-type region 16 is disposed opposite the p+-type region 3a and the first n-type emitter layer 4.

Figure 26:
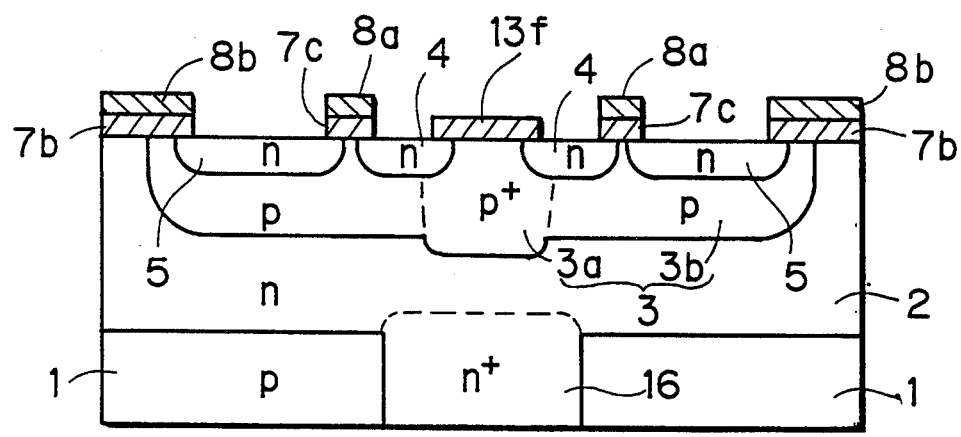
FIGS. 26 and 27 are views of a modified structure of FIG. 23 during successive stages in its manufacturing process.

The third preferred embodiment does not require that the first n-type emitter layer 4 is thinner than the second n-type emitter layer 5. Hence, the first and the second n-type emitter layers 4 and 5 can be formed in the same process steps as follows. As shown in FIG. 26, an oxide film 13f covering the p+-type region 3a is grown, and so are a ring-shaped oxide film 7c surrounding the oxide film 13f and another oxide film 7b covering the n-type base layer 2 and a peripheral portion of the p-type region 3b. The gate electrodes 8a, 8b are formed on the oxide films 7b and 7c, respectively. By introducing impurities into the p-type base layer 3 which is masked by the oxide films 7b, 7c and 13f and the gate electrodes 8a, 8b, the first and the second n-type emitter layers 4 and 5 are defined.

The oxide film 13f is then removed. Next, another oxide film is grown which covers side and top surfaces of the oxide films 7b and 7c and the gate electrodes 8a, 8b and the second n-type emitter layer 5, thereby forming the oxide film 7 in which the gate electrodes 8a, 8b are buried (FIG. 27).

Figure 27:
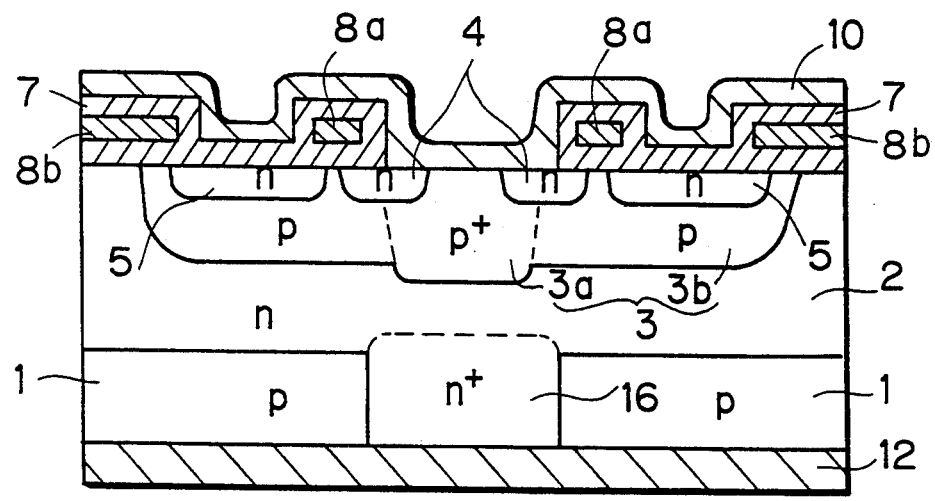

Likewise the EST structures heretofore described, cell-to-cell connection makes it possible in the EST structure of FIG. 27 to keep the gate electrode 8a over the first and the second n-type emitter layers 4 and 5 at the same potential as the gate electrode 8b over the second n-type emitter layer 5 and the n-type base layer 2.

<Preferred Embodiment 4>

From the description of the self arc-extinguishing thyristor of the present invention, it is understood that the channel region CH2 is not essential to the thyristor structures.

Figure 28:
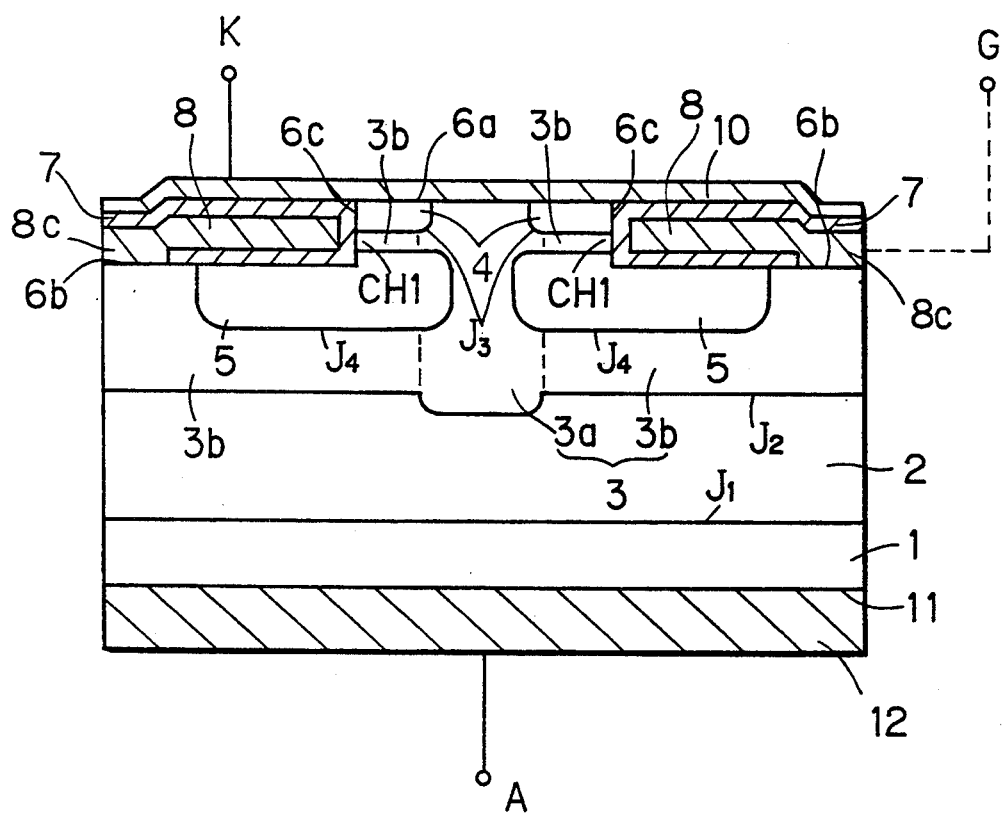
FIG. 28 is a cross sectional view showing a fourth preferred embodiment of the present invention.

FIG. 28 is a cross sectional view of a unit cell 105, or a modification of the second preferred embodiment. In the unit cell 105, the gate oxide film 7 does not completely cover the n-type base layer 2 and allows an end portion 8c of the gate electrode 8 to electrically contact with the p-type base layer 3 in the recessed surface 6b.

Even without assistance of the channel region CH2, a higher potential at the gate electrode 8 than at the cathode electrode 10 initiates a current flow from the gate electrode 8 to the cathode electrode 10, with a consequence that the unit cell 105 is turned on. Of great importance, a main thyristor is latched promptly which is formed by the p-type anode layer 1, the n-type base layer 2, the p-type base layer 3 and the second n-type emitter layer 5, thus suppressing power loss even when a main current is small.

The unit cell 105 of this modification is turned off by removing the gate voltage applied to the gate electrode 8 and consequently blocking a current flow in the channel region CH1, which is similar to the second preferred embodiment. A parasitic thyristor would not be easily latched which is formed by the p-type anode layer 1, the n-type base layer 2, the p-type base layer 3 and the first n-type emitter layer 4.

Figure 29:
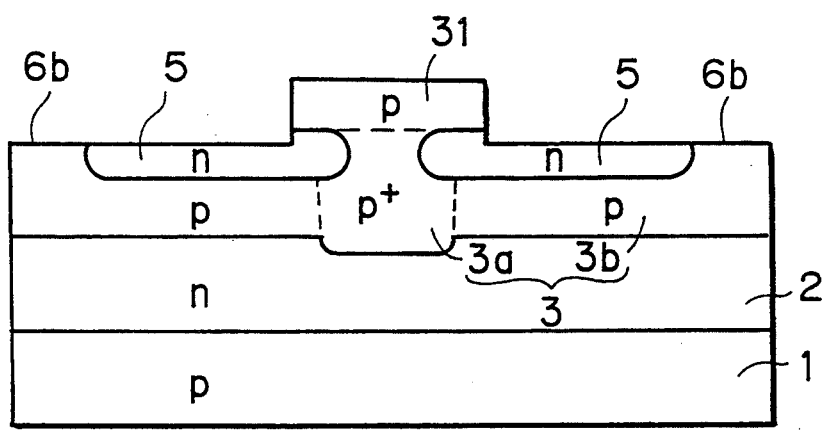
FIGS. 29 to 31 arc views of the structure of FIG. 28 during successive stages in its manufacturing process.
Figure 30:
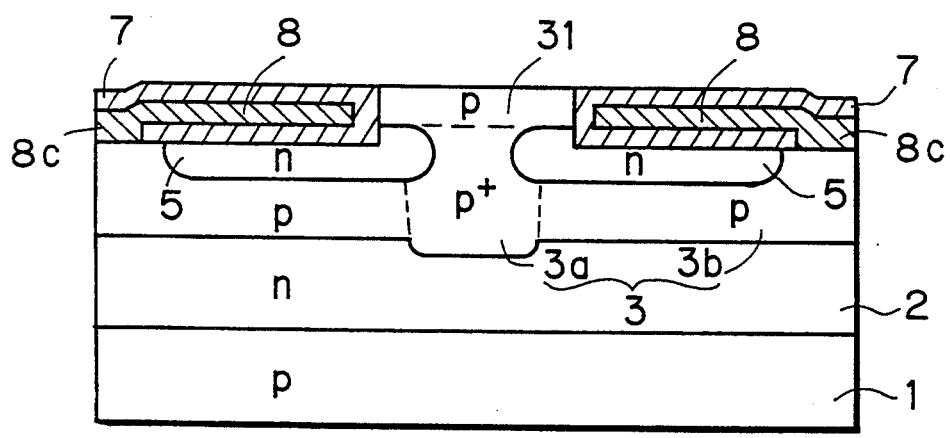
Figure 31:
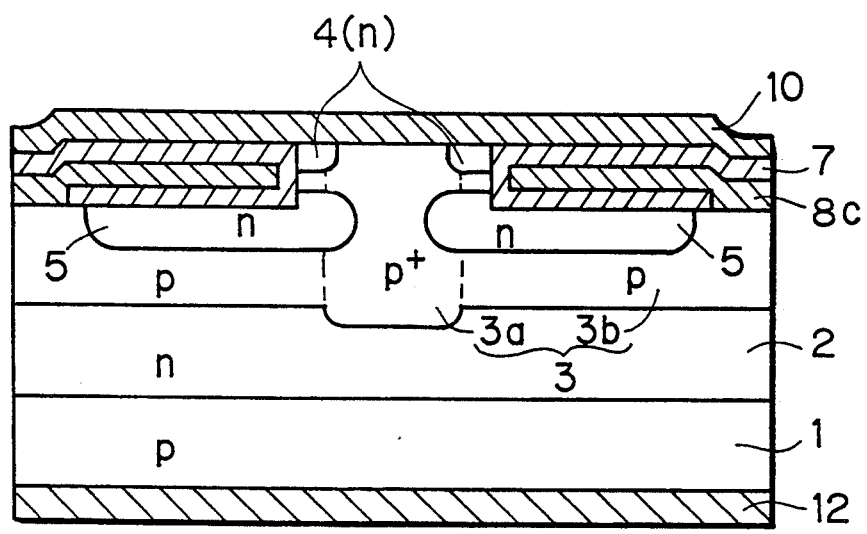

A manufacturing method of the unit cell 105 is shown in FIGS. 29 to 31. The illustrative manufacturing method corresponds to a manufacturing method of a self arc-extinguishing thyristor of the fourth aspect of the invention.

Figure 14:
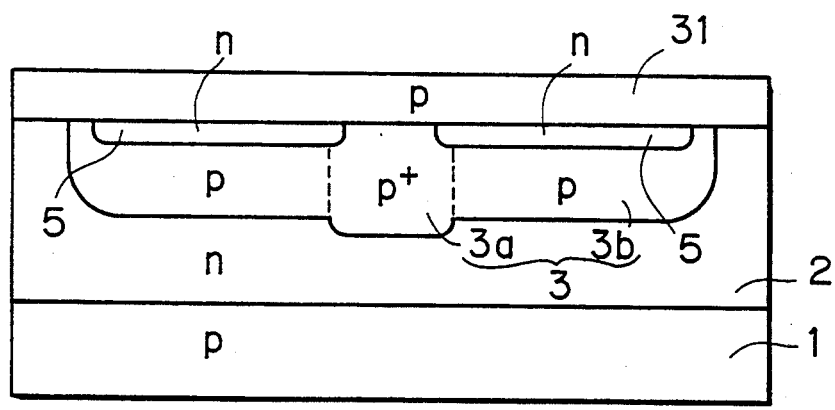
Figure 15:
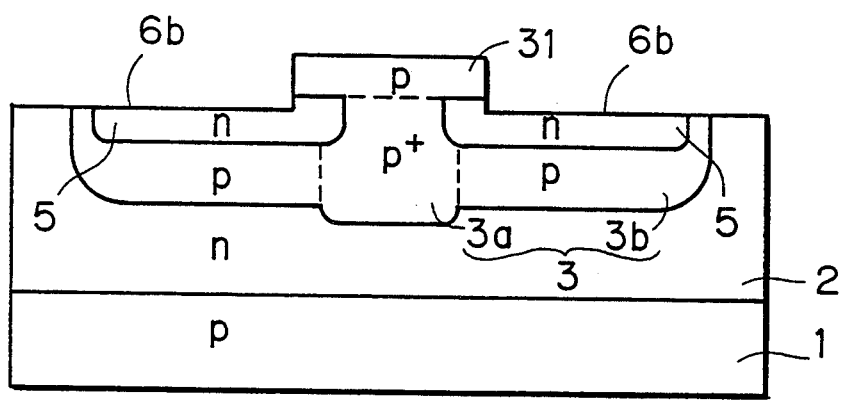
Figure 16:
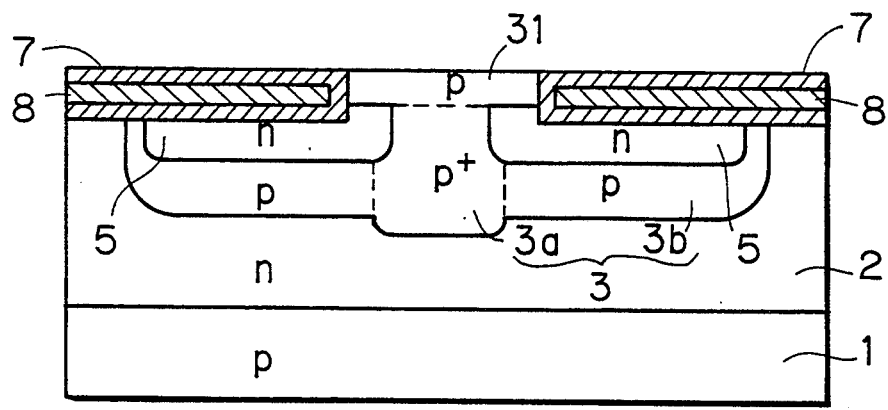

Process steps as those shown in FIGS. 13 to 15 are performed to form the p-type anode layer 1, the n-type base layer 2, the p-type base layer 3, the second n-type emitter layer 5 and the p-type layer 31 so as to define the recessed surface 6b. The p-type base layer 3 may be formed on the entire top surface of the n-type base layer 2 since the channel region CH2 is unnecessary (FIG. 29).

Then, the gate electrode 8 is formed which has the end portion 8c which is eventually connected with the p-type base layer 3 at the recessed surface 6b, immediately followed by provision of the gate oxide film 7 in which the gate electrode 8 is buried (FIG. 30).

Treatments as those shown in FIG. 17 and 18 are then performed in which the p-type layer 31 is integrated with the p+-type region 3a, the first n-type emitter layer 4 is created, and the cathode and the anode electrodes 10, 12 are formed. This completes fabrication of the unit cell 105 (FIG. 31).

If necessary, the gate electrode 8 and the end portion 8c are formed spaced apart and electrically connected with each other by a suitable resistor and the like. This modification has no influence over device operation.

This modification is also applicable to the first to the third preferred embodiments with no damage to the effect of the invention, which is needless to mention.

While the invention has been shown and described in detail, the foregoing description is in all aspects illustrative and not restrictive. It is understood that numerous modifications and variations can be devised without departing from the scope of the invention.

I claim:

1. A self arc-extinguishing thyristor comprising:
   (a) a body including:
   (a-1) a first conductivity type first semiconductor layer;
   (a-2) a second conductivity type second semiconductor layer formed on said first semiconductor layer;
   (a-3) a first conductivity type third semiconductor layer selectively formed in a top surface of said second semiconductor layer;
   (a-4) a second conductivity type fourth semiconductor layer selectively formed in a top surface of said third semiconductor layer; and
   (a-5) a second conductivity type fifth semiconductor layer selectively formed spaced from said fourth semiconductor layer in said top surface of said third semiconductor layer so that a bottom surface of said fifth semiconductor layer is farther from said second semiconductor layer than a bottom surface of said fourth semiconductor layer;
   (b) an insulation film disposed on a top surface of said body at least from said fourth to said fifth semiconductor layers;
   (c) a control electrode disposed in said insulation film so as to be in a faced relation with said third semiconductor layer;
   (d) a first electrode disposed in electrical connection with said third and fifth semiconductor layers; and
   (e) a second electrode disposed in electrical connection with said first semiconductor layer;

wherein said fifth semiconductor layer intercepts said top surface of said body in a ring shape and said third semiconductor layer consists of:

(a-3-1) a relatively heavily doped first portion which is surrounded by said fifth semiconductor layer at said top surface of said body; and (a-3-2) a relatively lightly doped second portion surrounding said first portion, said second portion together with said first portion completely occupying said third semiconductor layer; and wherein said fourth semiconductor layer is formed in a top surface of said second portion; and said fifth semiconductor layer is formed in a top surface of said first portion and said top surface of said second portion at a boundary therebetween.

2. The self arc-extinguishing thyristor of claim 1, wherein said fourth semiconductor layer surrounds said fifth semiconductor layer at said top surface of said body.

3. The self arc-extinguishing thyristor of claim 1, wherein said insulation film includes (b-1) an additional portion which extends from said second semiconductor layer, which adjoins said top surface of said body, to said fourth semiconductor layer.

4. A self arc-extinguishing thyristor comprising:
(a) a body including:
(a-1) a first conductivity type first semiconductor layer having a relatively low impurity concentration;
(a-2) a second conductivity type second semiconductor layer formed on said first semiconductor layer;
(a-3) a first conductivity type third semiconductor layer selectively formed in a top surface of said second semiconductor layer;
(a-4) a second conductivity type fourth semiconductor layer selectively formed in a top surface of said third semiconductor layer;
(a-5) a second conductivity type fifth semiconductor layer selectively formed spaced from said fourth semiconductor layer in said top surface of said third semiconductor layer; and
(a-6) a relatively heavily doped first conductivity type sixth semiconductor layer selectively formed in said first semiconductor layer so as to face said fifth semiconductor layer through said second and said third semiconductor layers and so as to extend into said second semiconductor layer;
(b) an insulation film disposed on a top surface of said body at least from said fourth semiconductor layer to said fifth semiconductor layer;
(c) a control electrode disposed at least in said insulation film so as to be in a faced relation with said third semiconductor layer;
(d) a first electrode disposed in electrical connection with said third and said fifth semiconductor layers; and
(e) a second electrode disposed in electrical connection with said first and said sixth semiconductor layers.

5. The self arc-extinguishing thyristor of claim 4, wherein said fourth semiconductor layer surrounds said fifth semiconductor layer at said top surface of said body.

6. The self arc-extinguishing thyristor of claim 5, wherein said fifth semiconductor layer intercepts said top surface of said body in a ring shape and said third semiconductor layer consists of:

(a-3-1) a relatively heavily doped first portion which is surrounded by said fifth semiconductor layer at said top surface of said body; and (a-3-2) a relatively lightly doped second portion, said second portion together with said first portion completely occupying said third semiconductor layer.

7. The self arc-extinguishing thyristor of claim 6, wherein said insulation film includes (b-1) an additional portion which extends from said second semiconductor layer, which adjoins said top surface of said body, to said fourth semiconductor layer.

8. A self arc-extinguishing thyristor comprising:
(a) a body including:
(a-1) a first conductivity type first semiconductor layer;
(a-2) a second conductivity type second semiconductor layer formed on said first semiconductor layer so as to have at its top surface a recessed surface and a protrusion which projects upward from said recessed surface;
(a-3) a first conductivity type third semiconductor layer selectively formed in a top surface of said second semiconductor layer so as to include at least said protrusion and a portion of said recessed surface which is contiguous to said protrusion;
(a-4) a second conductivity type fourth semiconductor layer selectively formed in a top surface of said third semiconductor layer; and
(a-5) a second conductivity type fifth semiconductor layer selectively formed in said top surface of said third semiconductor layer in space from said fourth semiconductor layer in said protrusion so that a bottom surface of said fifth semiconductor layer is farther from said second semiconductor layer than a bottom surface of said fourth semiconductor layer;
(b) an insulation film disposed on a top surface of said body at least from said fourth semiconductor layer to said fifth semiconductor layer;
(c) a control electrode disposed at least in said insulation film so as to be in a faced relation with said third semiconductor layer;
(d) a first electrode disposed in electrical connection with said third and said fifth semiconductor layers; and
(c) a second electrode disposed in electrical connection with said first semiconductor layer.

9. The self arc-extinguishing thyristor of claim 8, wherein a top surface of said fourth semiconductor layer is below said bottom surface of said fifth semiconductor layer.

10. The self arc-extinguishing thyristor of claim 9, wherein said fourth semiconductor layer intercepts a surface of said body only at said recessed surface and side surfaces of said protrusion.

11. The self arc-extinguishing thyristor of claim 10, wherein said fifth semiconductor layer intercepts said top surface of said protrusion in a ring shape and said third semiconductor layer consists of:

(a-3-1) a relatively heavily doped first portion which is surrounded by said fifth semiconductor layer at said top surface of said protrusion; and (a-3-2) a relatively lightly doped second portion surrounding said first portion, said second portion together with said first portion completely occupying said third semiconductor layer;

wherein said fourth semiconductor layer is formed in a top surface of said second portion; and said fifth semiconductor layer is formed in a top surface of said first portion and said top surface of said second portion at a boundary therebetween.

12. The self arc-extinguishing thyristor of claim 11, wherein said insulation film includes (b-1) an additional portion which extends from said second semiconductor layer, which adjoins said top surface of said body, to said fourth semiconductor layer.

13. The self arc-extinguishing thyristor of claim 11, wherein said control electrode is electrically connected with said third semiconductor layer.

14. The self arc-extinguishing thyristor of claim 13, wherein said third semiconductor layer entirely contains, at said top surface of said second semiconductor layer, said protrusion and said recessed surface contiguous thereto.

15. The self arc-extinguishing thyristor of claim 12, wherein said top surface of said protrusion projects upward from a top surface of said insulation film.

16. The self arc-extinguishing thyristor of claim 15, further comprising a first external electrode which is in pressure contact with said first electrode.

17. The self arc-extinguishing thyristor of claim 16, further comprising a second external electrode which is a pressure contact with said second electrode.

* * * * *